(12) United States Patent
Inoue

(10) Patent No.: US 9,148,121 B2
(45) Date of Patent: Sep. 29, 2015

(54) ACOUSTIC WAVE FILTER, DUPLEXER, AND MODULE

(71) Applicant: TAIYO YUDEN CO., LTD., Tokyo (JP)

(72) Inventor: Shogo Inoue, Tokyo (JP)

(73) Assignee: TAIYO YUDEN CO., LTD., Tokyo (JP)

( * ) Notice: Subject to any disclaimer, the term of this patent is extended or adjusted under 35 U.S.C. 154(b) by 160 days.

(21) Appl. No.: 13/950,600

(22) Filed: Jul. 25, 2013

(65) Prior Publication Data

US 2014/0049340 A1 Feb. 20, 2014

(30) Foreign Application Priority Data

Aug. 17, 2012 (JP) ................................. 2012-181099

(51) Int. Cl.
| H03H 9/25 | (2006.01) |
| H03H 9/72 | (2006.01) |
| H03H 9/02 | (2006.01) |
| H03H 9/145 | (2006.01) |
| H03H 9/64 | (2006.01) |
| H03H 9/00 | (2006.01) |

(52) U.S. Cl.
CPC ............. *H03H 9/25* (2013.01); *H03H 9/02637* (2013.01); *H03H 9/14538* (2013.01); *H03H 9/6483* (2013.01); *H03H 9/725* (2013.01)

(58) Field of Classification Search
CPC ........ H03H 9/64; H03H 9/6483; H03H 9/725
USPC .......................................... 333/133, 193–196
See application file for complete search history.

(56) References Cited

U.S. PATENT DOCUMENTS

| 5,313,177 | A | * | 5/1994 | Hickernell et al. ........... 333/193 |
| 5,874,869 | A | * | 2/1999 | Ueda et al. ..................... 333/193 |
| 6,137,380 | A | * | 10/2000 | Ushiroku et al. ............. 333/193 |
| 6,762,657 | B2 | * | 7/2004 | Takamine ....................... 333/193 |
| 6,903,626 | B2 | * | 6/2005 | Tsutsumi et al. ............. 333/193 |
| 6,946,931 | B2 | * | 9/2005 | Inoue et al. .................... 333/195 |
| 6,972,644 | B2 | * | 12/2005 | Nishizawa et al. ........... 333/195 |

FOREIGN PATENT DOCUMENTS

| JP | 8-298430 A | 11/1996 |
| JP | 9-284091 A | 10/1997 |

* cited by examiner

*Primary Examiner* — Dean Takaoka
(74) *Attorney, Agent, or Firm* — Chen Yoshimura LLP

(57) ABSTRACT

An acoustic wave filter includes: at least a parallel resonator, wherein at least one of the parallel resonator includes a piezoelectric substance, an IDT located on the piezoelectric substance, and reflectors located on the piezoelectric substance so as to sandwich the IDT, and a distance between a first electrode finger that is an electrode finger closest to the reflector among electrode fingers of the IDT and a second electrode finger that is an electrode finger closest to the IDT among electrode fingers of the reflector is less than $0.25(\lambda_{IDT}+\lambda_{ref})$ where a period of the electrode fingers of the IDT is $\lambda_{IDT}$ and a period of the electrode fingers of the reflector is $\lambda_{ref}$.

14 Claims, 22 Drawing Sheets

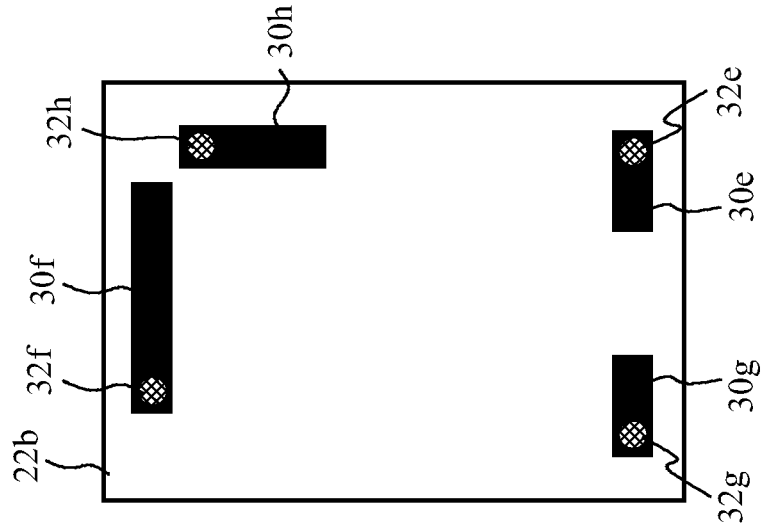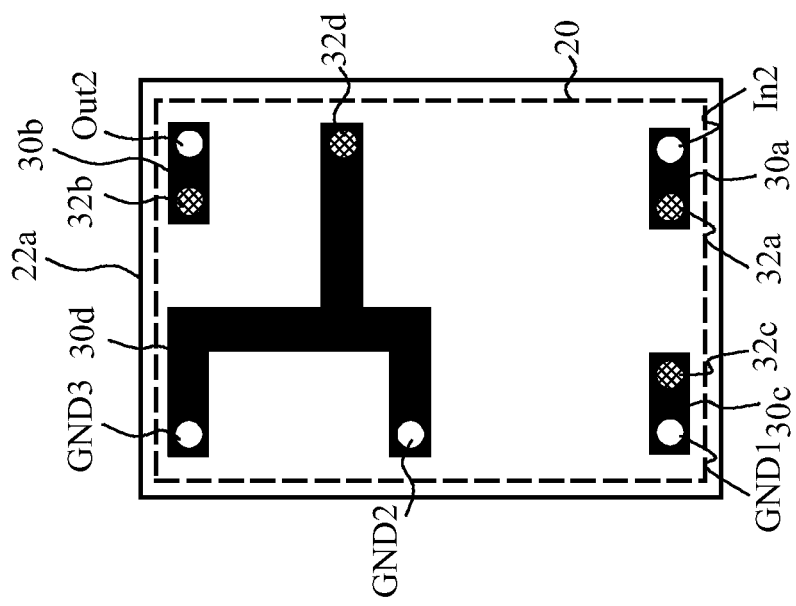

1

ACOUSTIC WAVE FILTER, DUPLEXER, AND MODULE

CROSS-REFERENCE TO RELATED APPLICATION

This application is based upon and claims the benefit of priority of the prior Japanese Patent Application No. 2012-181099, filed on Aug. 17, 2012, the entire contents of which are incorporated herein by reference.

FIELD

A certain aspect of the present invention relates to an acoustic wave filter, a duplexer, and a module.

BACKGROUND

Acoustic wave filters such as surface acoustic wave (SAW) filters have been often used as filters used in communication devices such as mobile phones. The SAW filter includes a piezoelectric substrate and an IDT (Interdigital Transducer: comb-shaped electrode) located on the upper surface of the piezoelectric substrate. In addition, a duplexer and a module including filters may be installed in the communication device. The filter is required to have frequency characteristics achieving low-loss in the passband and high suppression outside the passband. The low-loss frequency characteristic enables to reduce the electrical power consumption of the communication device, and improve the speech quality. Japanese Patent Application Publication Nos. 9-284091 and 8-298430 disclose resonators that adjust the distance between the IDT and the reflector.

The loss in the passband is in a trade-off relationship with the degree of suppression outside the passband. For example, when the loss of a signal is reduced, the degree of suppression decreases.

SUMMARY OF THE INVENTION

According to an aspect of the present invention, there is provided an acoustic wave filter including: at least a parallel resonator, wherein at least one of the parallel resonator includes a piezoelectric substance, an IDT located on the piezoelectric substance, and reflectors located on the piezoelectric substance so as to sandwich the IDT, and a distance between a first electrode finger that is an electrode finger closest to the reflector among electrode fingers of the IDT and a second electrode finger that is an electrode finger closest to the IDT among electrode fingers of the reflector is less than $0.25(\lambda_{IDT}+\lambda_{ref})$ where a period of the electrode fingers of the IDT is $\lambda_{IDT}$ and a period of the electrode fingers of the reflector is $\lambda_{ref}$.

According to another aspect of the present invention, there is provided an acoustic wave filter including: at least a parallel resonator, wherein at least one of the parallel resonator includes a piezoelectric substance, an IDT located on the piezoelectric substance, and reflectors located on the piezoelectric substance so as to sandwich the IDT, and $\lambda_{IDT}$ is greater than $\lambda_{ref}$ where a period of electrode fingers of the IDT is $\lambda_{IDT}$ and a period of electrode fingers of the reflector is $\lambda_{ref}$.

According to another aspect of the present invention, there is provided a duplexer including the above described acoustic wave filter.

According to another aspect of the present invention, there is provided a module including the above described acoustic wave filter.

BRIEF DESCRIPTION OF THE DRAWINGS

FIG. 16A is a plan view illustrating a first layer of a package, FIG. 16B is a plan view illustrating a second layer of the package, and FIG. 16C is a plan view transparently illustrating a third layer of the package;

DETAILED DESCRIPTION

Figure 1A:
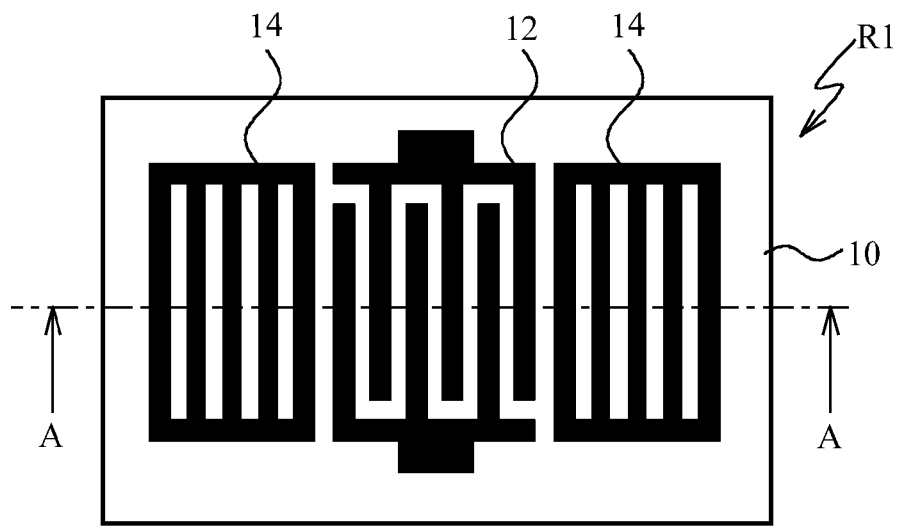
FIG. 1A is a plan view illustrating a SAW resonator.
Figure 1B:
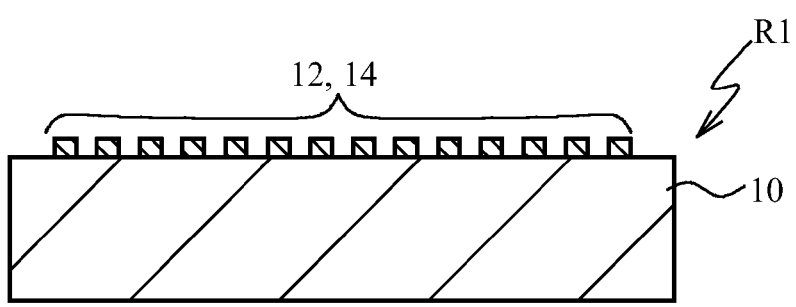
FIG. 1B is a cross-sectional view illustrating the SAW resonator.

A description will first be given of a SAW resonator. FIG. 1A is a plan view illustrating a SAW resonator R1. FIG. 1B is a cross-sectional view illustrating the SAW resonator R1.

As illustrated in FIG. 1A and FIG. 1B, an IDT 12 and reflectors 14 are located on a piezoelectric substance 10. The piezoelectric substance means a piezoelectric film formed of a piezoelectric single crystal substrate such as lithium tantalate (LiTaO$_3$) or lithium niobate (LiNbO$_3$) and a thin film of these piezoelectric substances formed on an insulating material, for example. Two reflectors 14 sandwich the IDT 12. The IDT 12 and the reflectors 14 include electrode fingers. The IDT 12 to which voltage is applied excites an acoustic wave with a frequency corresponding to the pitch of the electrode fingers. The reflectors 14 reflect the acoustic wave. The IDT 12 and the reflectors 14 are formed of a metal such as aluminum (Al) for example.

Figure 1C:
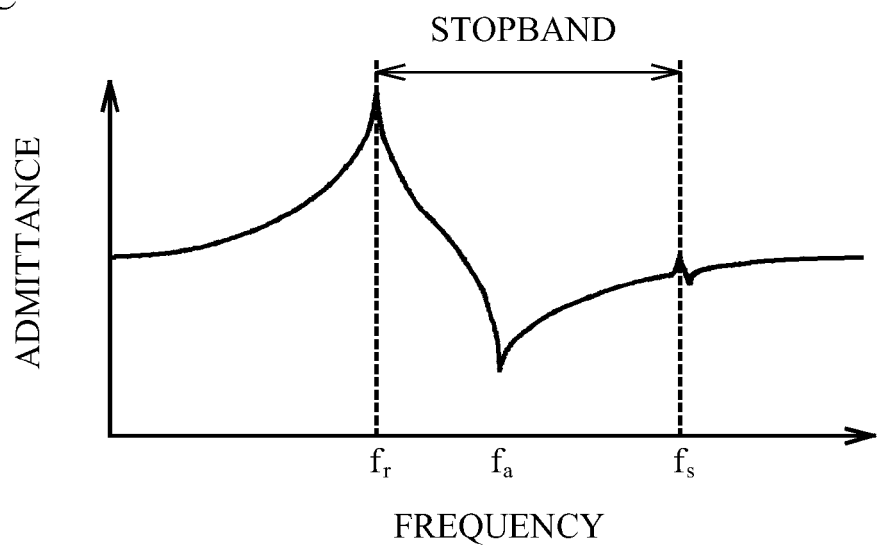
FIG. 1C is a graph illustrating the admittance characteristic of the SAW resonator.

FIG. 1C is a graph illustrating the admittance characteristic of the SAW resonator R1. The horizontal axis represents frequency, and the vertical axis represents admittance. As illustrated in FIG. 1C, the admittance has the maximum value at a resonance frequency $f_r$, and has the minimum value at an anti-resonance frequency $f_a$ higher than the resonance frequency $f_r$. In addition, a small resonant response occurs at a frequency $f_s$. The resonance frequency $f_r$ is located at the lower end of the stopband of the IDT 12, and the frequency $f_s$ is located at the upper end of the stopband.

Figure 2A:
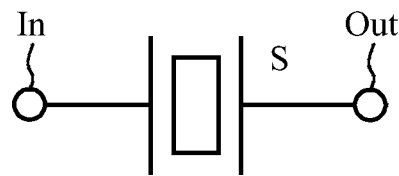
FIG. 2A illustrates a case where a resonator connected in series between terminals.
Figure 2B:
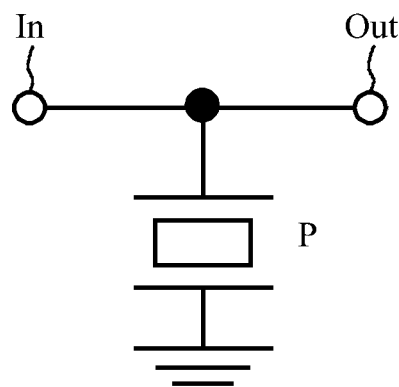
FIG. 2B illustrates a case where a resonator connected in parallel between terminals.

FIG. 2A illustrates a case where a resonator is connected in series between terminals. FIG. 2B illustrates a case where a resonator is connected in parallel between terminals. A series resonator S of FIG. 2A is the SAW resonator R1 for example, and is connected in series between an input terminal In and an output terminal Out. A parallel resonator P of FIG. 2B is the SAW resonator R1, and is connected in parallel between the input terminal In and the output terminal Out.

Figure 2C:
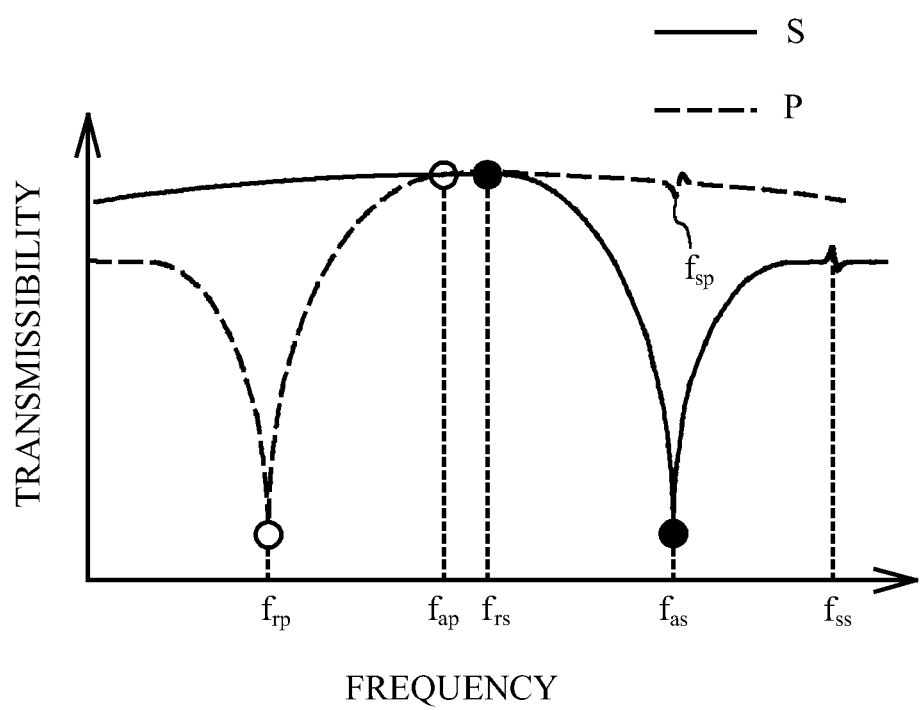
FIG. 2C is a graph illustrating frequency characteristics.

FIG. 2C is a graph illustrating a frequency characteristic. The horizontal axis represents frequency, and the vertical axis represents transmissibility. The solid line represents the frequency characteristic of the series resonator S, and the dashed line represents the frequency characteristic of the parallel resonator P.

As illustrated in FIG. 2C, the transmissibility of the series resonator S has the maximum value at a resonance frequency $f_{rs}$, and the minimum value at an anti-resonance frequency $f_{as}$. A small resonant response occurs at a frequency $f_{ss}$ higher than the anti-resonance frequency $f_{as}$. The transmissibility of the parallel resonator P has the minimum value at a resonance frequency $f_{rp}$, and has the maximum value at an anti-resonance frequency $f_{ap}$. A small resonant response occurs at a frequency $f_{sp}$ higher than the anti-resonance frequency $f_{ap}$. The series resonator S functions as a low-pass filter having transition frequencies between the resonance frequency $f_{rs}$ and the anti-resonance frequency $f_{as}$. The parallel resonator P functions as a high-pass filter having transition frequencies between the resonance frequency $f_{rp}$ and the anti-resonance frequency $f_{ap}$. The transition frequencies are frequencies within which a transition from the passband to the suppression band occurs.

Figure 3A:
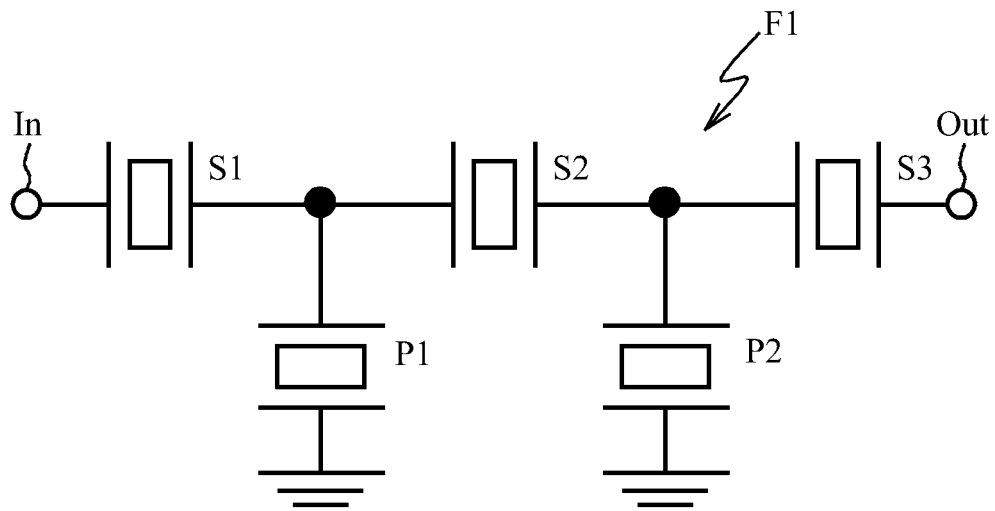
FIG. 3A is a circuit diagram illustrating a ladder-type filter.

A description will next be given of a ladder-type filter. FIG. 3A is a circuit diagram illustrating a ladder-type filter F1.

As illustrated in FIG. 3A, three series resonators S1 through S3 are connected between the input terminal In and the output terminal Out. A parallel resonator P1 is connected to a node between the series resonators S1 and S2, and a parallel resonator P2 is connected to a node between the series resonators S2 and S3. Each resonator is designed to have the resonance frequency $f_{rs}$ almost equal to the anti-resonance frequency $f_{ap}$.

Figure 3B:
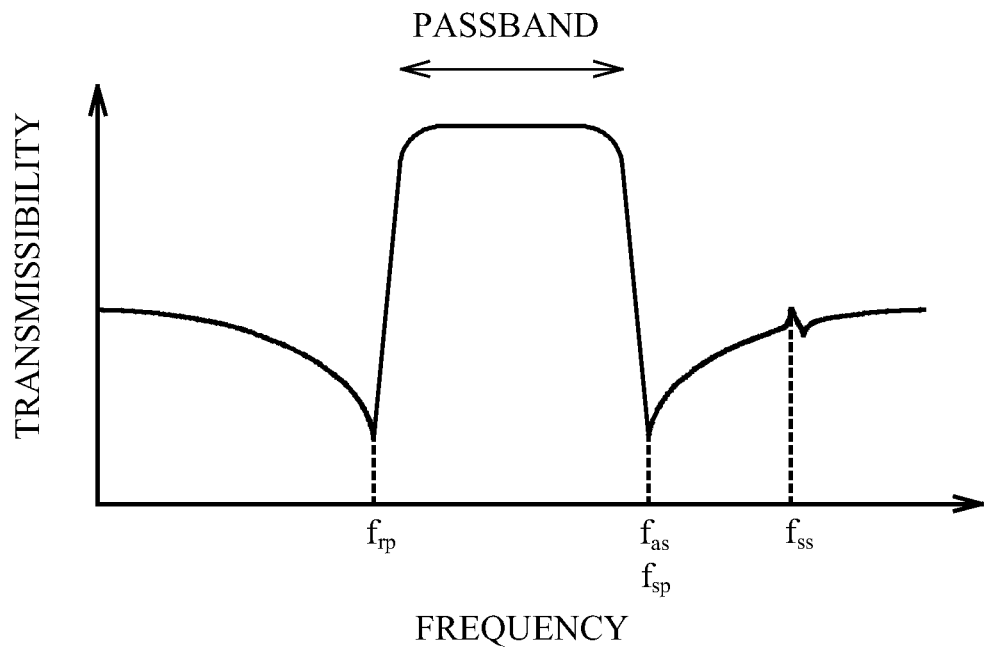
FIG. 3B is a graph illustrating the frequency characteristic of the ladder-type filter.

FIG. 3B is a graph illustrating the frequency characteristic of the ladder-type filter. As illustrated in FIG. 3B, the passband is from the resonance frequency $f_{rp}$ to the anti-resonance frequency $f_{as}$. Frequencies lower than the resonance frequency $f_{rp}$ and frequencies higher than the anti-resonance frequency $f_{as}$ form the suppression band. In the suppression band at a higher frequency side, a resonant response at the frequency $f_{ss}$ is observed. The frequency $f_{sp}$ approximately agrees with the upper end of the passband (end at a higher frequency side). Thus, the resonant response at the frequency $f_{sp}$ is buried in the high degree of suppression, and hardly observed.

As described above, the ladder-type filter F1 is required to have a frequency characteristic achieving low-loss in the passband and high suppression outside the passband. To reduce insertion loss in the passband, signals transmitted through the parallel resonators P1 and P2 are to be reduced in the passband. Therefore, the conductance of the parallel resonators P1 and P2 is to be reduced.

Figure 4:
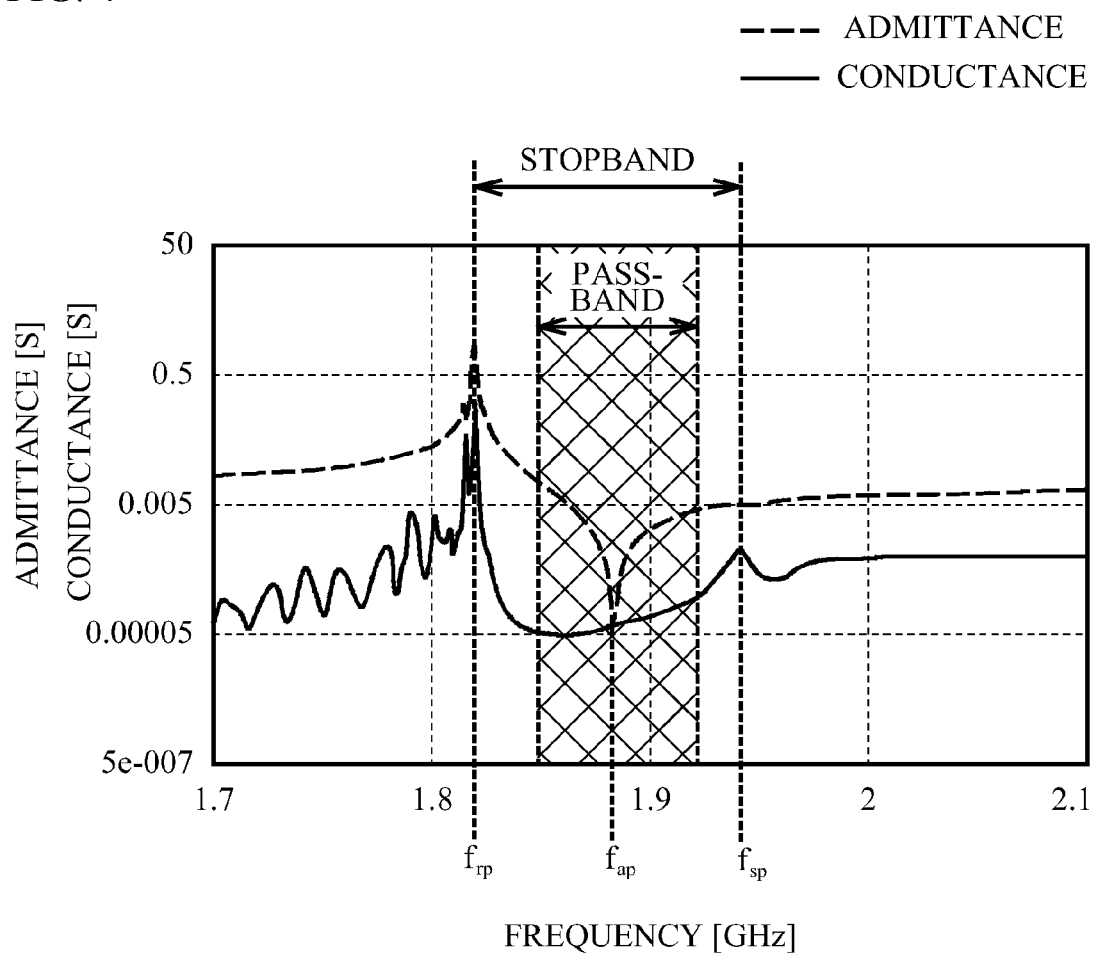
FIG. 4 is a graph illustrating calculation results of the conductance and admittance of a parallel resonator.

A description will be given of the conductance and admittance of the parallel resonators P1 and P2. FIG. 4 is a graph illustrating calculation results of the conductance and admittance of the parallel resonator P1. The horizontal axis represents frequency, and the vertical axis represents conductance and admittance. The solid line represents calculation results of conductance, and the dashed line represents calculation results of admittance. The conductance is a real part of the admittance. The passband of the ladder-type filter F1 is indicated by cross-hatching.

As illustrated in FIG. 4, the passband of the ladder-type filter F1 is 1850 to 1910 MHz, and covered by the stopband (resonance frequency $f_{rp}$ to frequency $f_{sp}$) of the parallel resonator P1. The parallel resonator P2 exhibits the same property. To reduce the insertion loss of the ladder-type filter F1, the conductance of the parallel resonators P1 and P2 in the passband is to be reduced.

The inventor of the present invention has found out a structure of a parallel resonator capable of reducing the conductance. A detailed description will be given hereinafter.

Figure 5:
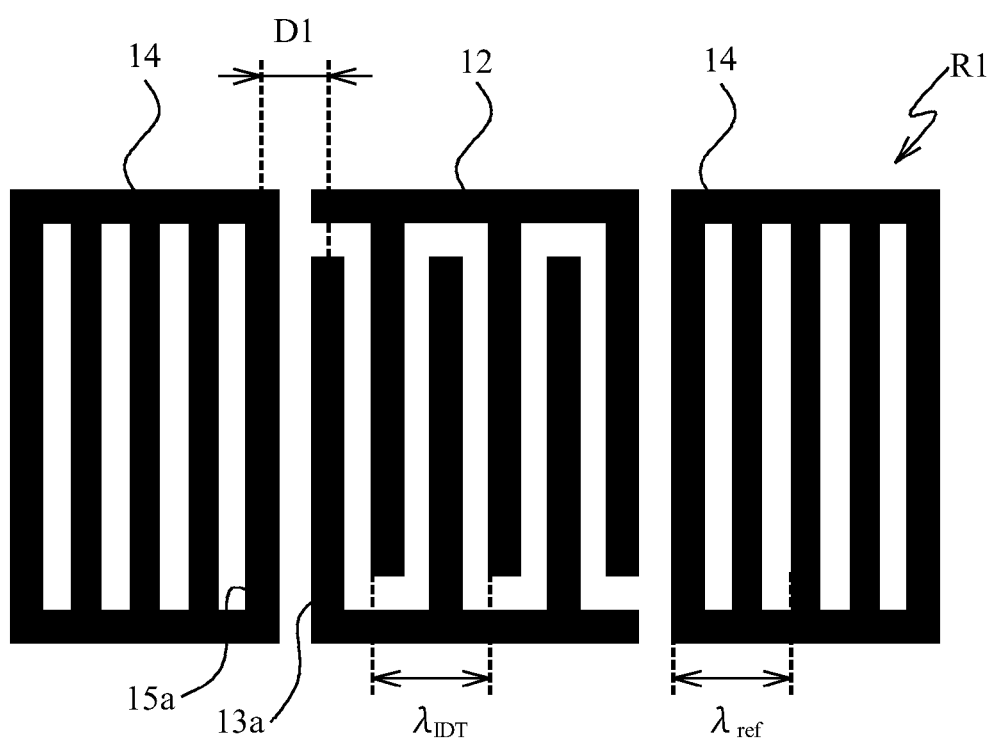
FIG. 5 is a plan view illustrating a SAW resonator.

FIG. 5 is a plan view illustrating the SAW resonator R1. The parallel resonator P is a SAW resonator, but the illustration of the piezoelectric substance 10 is omitted. As illustrated in FIG. 5, the period of the electrode fingers in the IDT 12 is expressed by $\lambda_{IDT}$, and the period of the electrode fingers in the reflector 14 is expressed by $\lambda_{ref}$. The period of the electrode fingers is the length of the array of the electrode fingers corresponding to the single wavelength of an acoustic wave. A distance D1 is a distance between the center of an electrode finger 13a (first electrode finger), which is closest to the reflector 14 among the electrode fingers of the IDT 12, and the center of an electrode finger 15a (second electrode finger), which is closest to the IDT 12 among the electrode fingers of the reflector 14. Generally, $\lambda_{IDT}$ is equal to $\lambda_{ref}$, and D1 is equal to $0.25(\lambda_{IDT}+\lambda_{ref})$.

The conductance and admittance when the period and the distance D1 are changed are simulated with a finite element method. The simulation uses $\Delta\lambda$ and G as parameters. $\Delta\lambda$ is expressed by equation 1, and G is expressed by equation 2.

$$\Delta\lambda = 100 \times (\lambda_{ref} - \lambda_{IDT})/\lambda_{IDT} \qquad \text{[Equation 1]}$$

$$D1 = 0.25 \times (\lambda_{ref} + \lambda_{IDT}) + G \qquad \text{[Equation 2]}$$

$\Delta\lambda=0\%$ means $\lambda_{IDT}=\lambda_{ref}$, and $\Delta\lambda<0$ means $\lambda_{IDT}>\lambda_{ref}$. G=0 means the distance $D1=0.25(\lambda_{IDT}+\lambda_{ref})$, and G<0 means that the distance D1 becomes less than $0.25(\lambda_{IDT}+\lambda_{ref})$.

The SAW resonator R1 used for the simulation is designed as follows. The following parameters are also used in the simulations described later in FIG. 6B and FIG. 7.
Piezoelectric substance 10: 42° Y—X cut LiTaO$_3$ Materials and thicknesses of the IDT 12 and the reflectors 14: Al, 185.5 nm
Number of pairs of the electrode fingers in the IDT 12: 92 pairs
Number of the electrode fingers in one reflector 14: 30
$\lambda_{IDT}$: 2.153 μm
Aperture length: 39.6 μm
Duty ratio of the electrode fingers in the IDT 12 and the reflectors 14: 53%

The duty ratio is a ratio of an electrode width to a single period. The aperture length is an overlapping length of the facing electrode fingers.

Figure 6A:
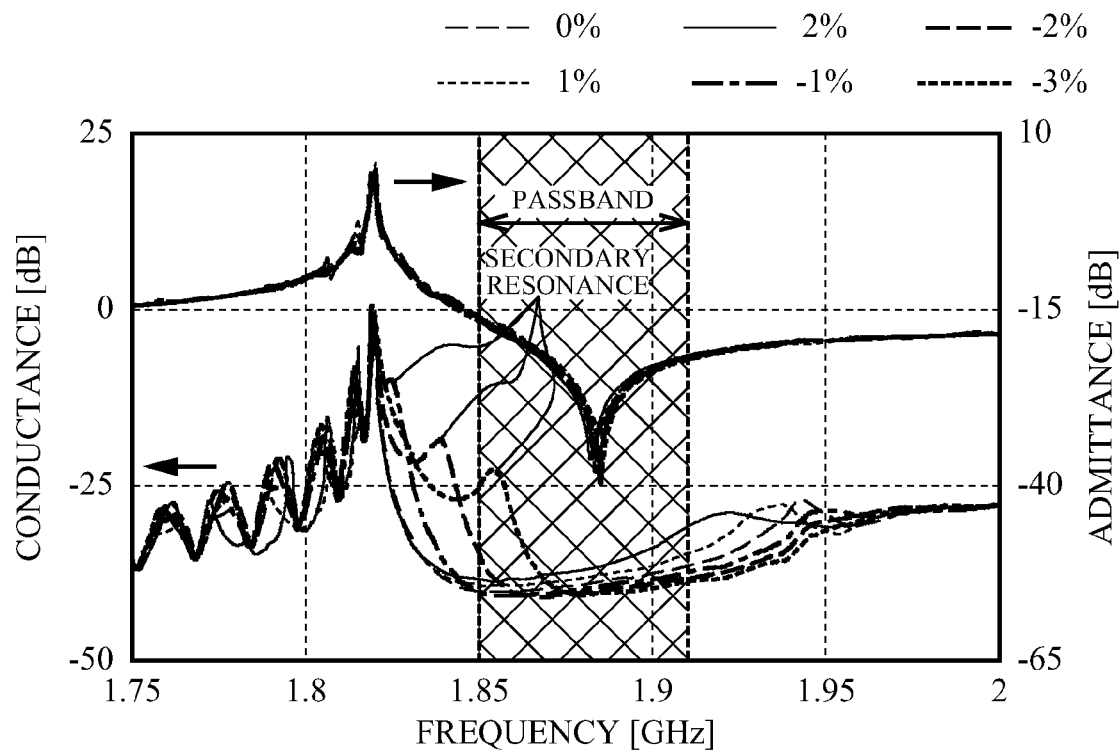
FIG. 6A and FIG. 6B are graphs illustrating calculation results of conductance and admittance.

A description will first be given of a case where the period is changed. FIG. 6A is a graph illustrating calculation results of conductance and admittance. The thin dashed line represents calculation results in a case of $\Delta\lambda=0\%$, the thin dotted line represents calculation results in a case of $\Delta\lambda=1\%$, the solid line represents calculation results in a case of $\Delta\lambda=2\%$, the chain line represents calculation results in a case of $\Delta\lambda=-1\%$, the bold dashed line represents calculation results in a case of $\Delta\lambda=-2\%$, and the bold dotted line represents calculation results in a case of $\Delta\lambda=-3\%$.

As illustrated in FIG. 6A, as $\Delta\lambda$ decreases, the conductance in the passband decreases. The conductance is greatly reduced especially at a higher frequency side. However, a secondary resonance occurs at a frequency higher than the resonance frequency. The secondary resonance is a resonance caused by the difference between $\lambda_{IDT}$ and $\lambda_{ref}$. The conductance becomes large near the secondary resonance point. For example, the secondary resonance point is located in the passband in the case of $\Delta\lambda=-3\%$ for example. Therefore, the conductance is large at the lower frequency side of the passband. To achieve the low-loss in the passband, the secondary resonance point is preferably located away from the passband. For example, configuring $\Delta\lambda$ to be equal to $-1\%$ enables to reduce the conductance and locate the secondary resonance point away from the passband. $\Delta\lambda$ may be greater than or equal to $-1\%$ and less than 0 such as less than $-0.8\%$, less than $-0.5\%$, less than $-0.25\%$, or less than $0.1\%$.

Figure 6B:
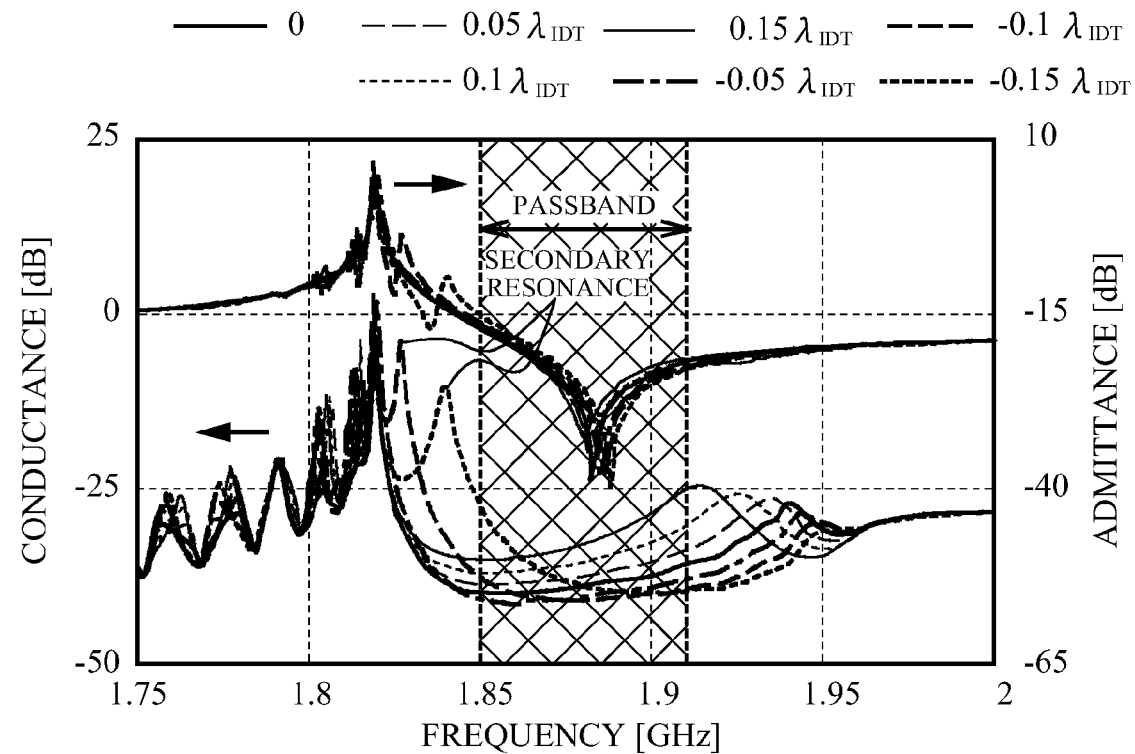

A description will next be given of a case where the distance D1 is changed. FIG. 6B is a graph illustrating calculation results of conductance and admittance. The bold solid line represents calculation results in a case of G=0, the thin dashed line represents calculation results in a case of G=0.05$\lambda_{IDT}$, the thin dotted line represents calculation results in a case of G=0.1$\lambda_{IDT}$, the thin solid line represents calculation results in a case of G=0.15$\lambda_{IDT}$, the chain line represents calculation results in a case of G=-0.05$\lambda_{IDT}$, the bold dashed line represents calculation results in a case of G=-0.1$\lambda_{IDT}$, and the bold dotted line represents calculation results in a case of G=-0.15$\lambda_{IDT}$. Here, $\lambda_{IDT}$ is equal to $\lambda_{ref}$=2.153 μm.

As illustrated in FIG. 6B, as G decreases, the conductance in the passband decreases. However, the change of the distance D1 causes the secondary resonance. For example, in a case of G=-0.15$\lambda_{IDT}$, the secondary resonance point is located near the passband. Therefore, the conductance is large at the lower frequency side of the passband. For example, configuring G to be equal to $-0.05\lambda_{IDT}$ enables to reduce the conductance and locate the secondary resonance point away from the passband. G may be greater than or equal to $-0.5\lambda$ and less than 0 such as $-0.04\lambda_{IDT}$, $-0.03\lambda_{IDT}$, $-0.02\lambda_{IDT}$, or $-0.01\lambda_{IDT}$. For example, configuring G to be less than or equal to $-0.0125\lambda_{IDT}$ enables to make the distance D1 less than or equal to $0.24375(\lambda_{IDT}+\lambda_{ref})$. As described above, even the slight change of the distance D1 can reduce the conductance.

A description will be given of a case where both the period and the distance D1 are changed. The conductance is simulated under the condition of $\Delta\lambda<0$ and G<0. As illustrated in FIG. 6A and FIG. 6B, the change of the parameters ($\Delta\lambda$ and G) shifts the anti-resonance frequency $f_a$. Performed is a correction that makes the anti-resonance frequency $f_a$ when the parameters are changed equal to the anti-resonance frequency $f_a$ when the parameters are not changed ($\Delta\lambda=0$, G=0).

Figure 7:
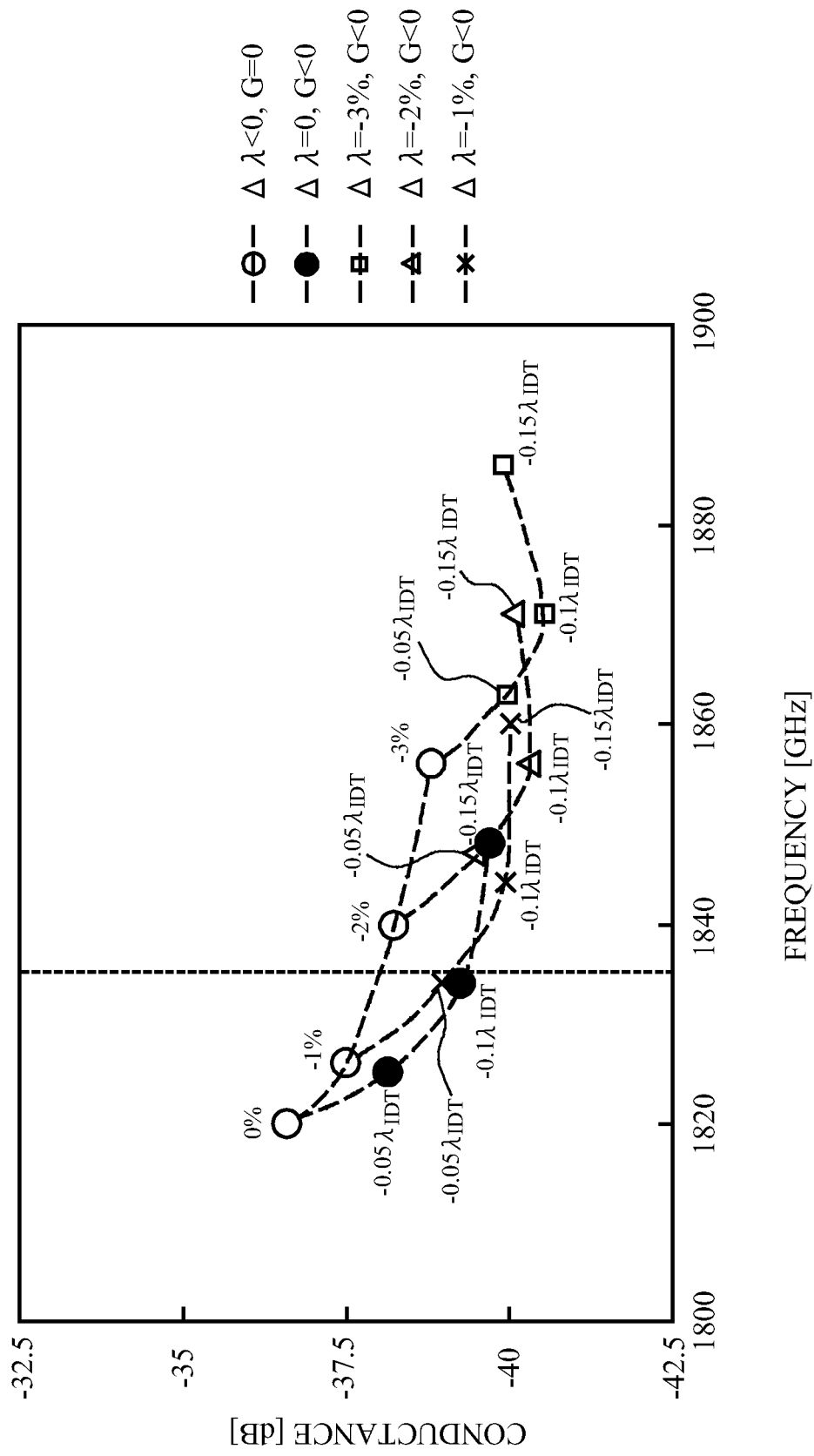
FIG. 7 is a graph illustrating calculation results of conductance.

FIG. 7 is a graph illustrating calculation results of conductance. The horizontal axis represents the frequency of the secondary resonance point (secondary resonance frequency) after the correction. The vertical axis represents the conductance at 1910 MHz after the correction. The outlined circle represents a case of $\Delta\lambda<0$ and G=0, and the black circle represents a case of $\Delta\lambda=0$ and G<0. The rectangle represents a case of $\Delta\lambda=-3\%$ and G<0, the triangle represents a case of $\Delta\lambda=-2\%$ and G<0, and the X mark represents a case of $\Delta\lambda=-1\%$ and G<0. The value of $\Delta\lambda$ is written near the open circle. The value of G is written near other points. The dotted line indicates 1835 MHz.

The comparison between the open circles and the black circles in FIG. 7 reveals that the conductance when only G is configured to be less than 0 can be reduced more than the conductance when only $\Delta\lambda$ is configured to be less than 0. In any of cases of $\Delta\lambda=-1$ to $-3\%$, the conductance can be further reduced by configuring G to be equal to $-0.15\lambda_{IDT}$. As described above, the synergistic effect between $\Delta\lambda<0$ and G<0 can further reduce the conductance.

To suppress the increase in the conductance due to the secondary resonance, the secondary resonance frequency is preferably made to be less than or equal to 1835 MHz. Therefore, in the examples illustrated in FIG. 7, it is preferable to configure $\Delta\lambda$ to be equal to $-1\%$ and G to be equal to $-0.05\lambda_{IDT}$, or configure $\Delta\lambda$ to be equal to 0 and G to be equal to $-0.01\lambda_{IDT}$. $\Delta\lambda$ and G may be arbitrarily changed in accordance with the passband. A description will next be given of a first embodiment.

First Embodiment

Figure 8:
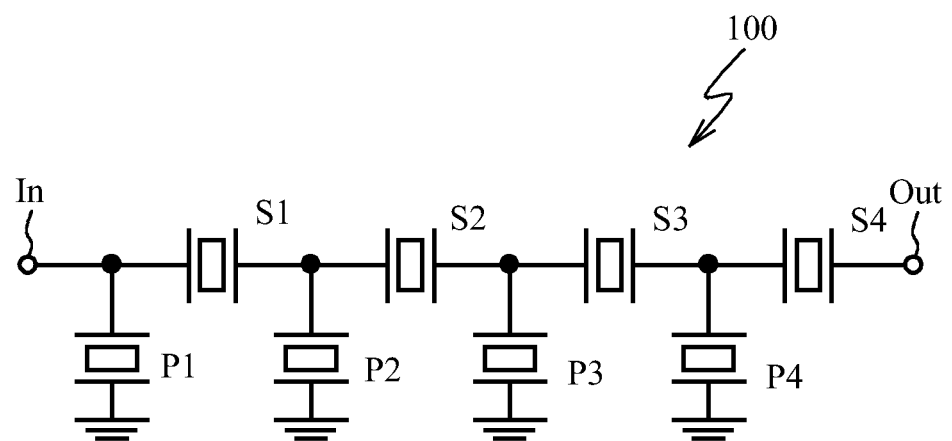
FIG. 8 is a circuit diagram illustrating a ladder-type filter in accordance with a first embodiment.

A description will be given of an application example to a ladder-type filter. FIG. 8 is a circuit diagram illustrating a ladder-type filter 100 in accordance with the first embodiment.

As illustrated in FIG. 8, series resonators S1 through S4 are connected between the input terminal In and the output terminal Out. The parallel resonator P1 is connected to a node between the In and the S1, the parallel resonator P2 is connected to a node between the S1 and the S2, the parallel resonator P3 is connected to the node between the S2 and the S3, and the parallel resonator P4 is connected to a node between the S3 and the S4.

The simulation is performed to obtain parameters ($\Delta\lambda$ and G) at which the conductance of the parallel resonators P1 through P4 becomes minimum. A first comparative example is an example before optimization. Table 1 is a table listing parameters of the parallel resonators P1 through P4 in the first comparative example and the first embodiment.

TABLE 1

| | RESONATOR | | | |
|---|---|---|---|---|
| | P1 | | P2 | |
| PARAMETER | $\Delta\lambda$ (%) | G | $\Delta\lambda$ (%) | G |

TABLE 1-continued

| | | | | |
|---|---|---|---|---|
| FIRST COMPARATIVE EXAMPLE | 0.23 | 0 | 0.55 | 0 |
| FIRST EMBODIEMNT | 0.23 | $-0.05\lambda_{IDT}$ | 0.55 | $-0.10\lambda_{IDT}$ |

| | RESONATOR | | | |
|---|---|---|---|---|
| | P3 | | P4 | |
| PARAMETER | Δλ (%) | G | Δλ (%) | G |
| FIRST COMPARATIVE EXAMPLE | 0.43 | 0 | 1.12 | 0 |
| FIRST EMBODIEMNT | 0 | $-0.10\lambda_{IDT}$ | −1.0 | 0 |

Figure 9A:
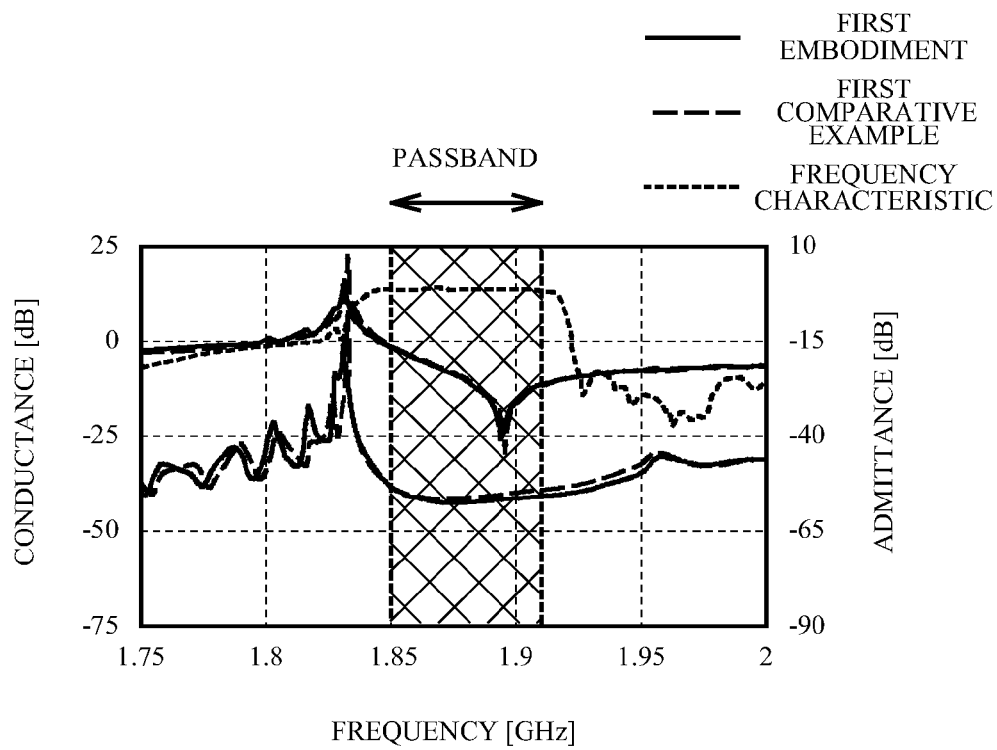
FIG. 9A and FIG. 9B are graphs illustrating calculation results of the conductance and admittance of a parallel resonator.
Figure 9B:
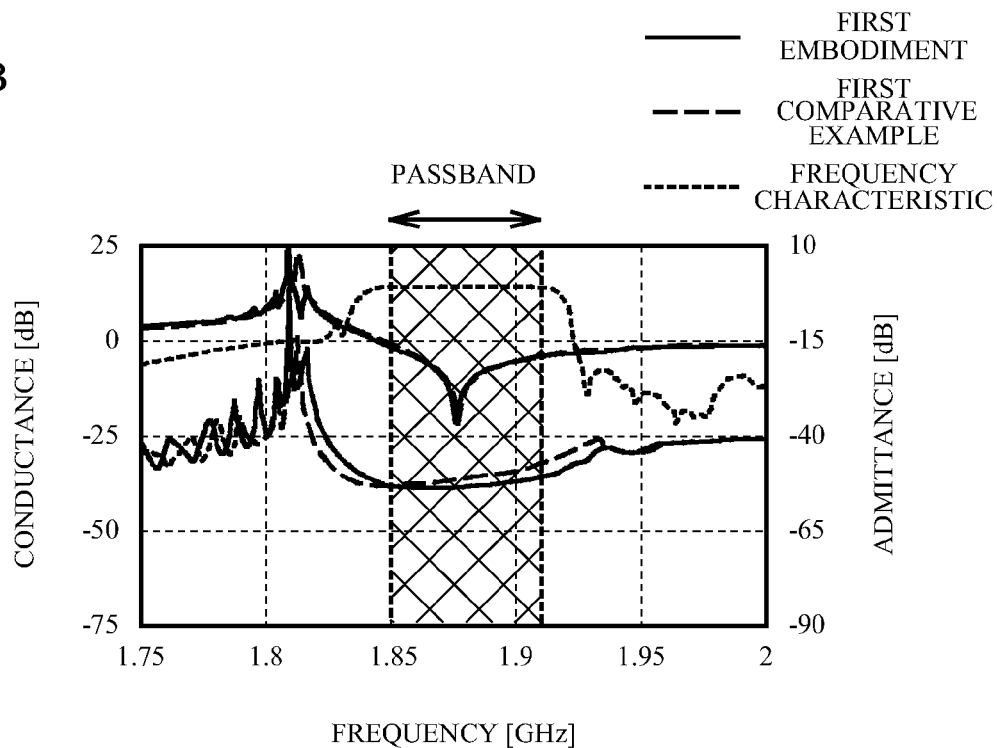
Figure 10A:
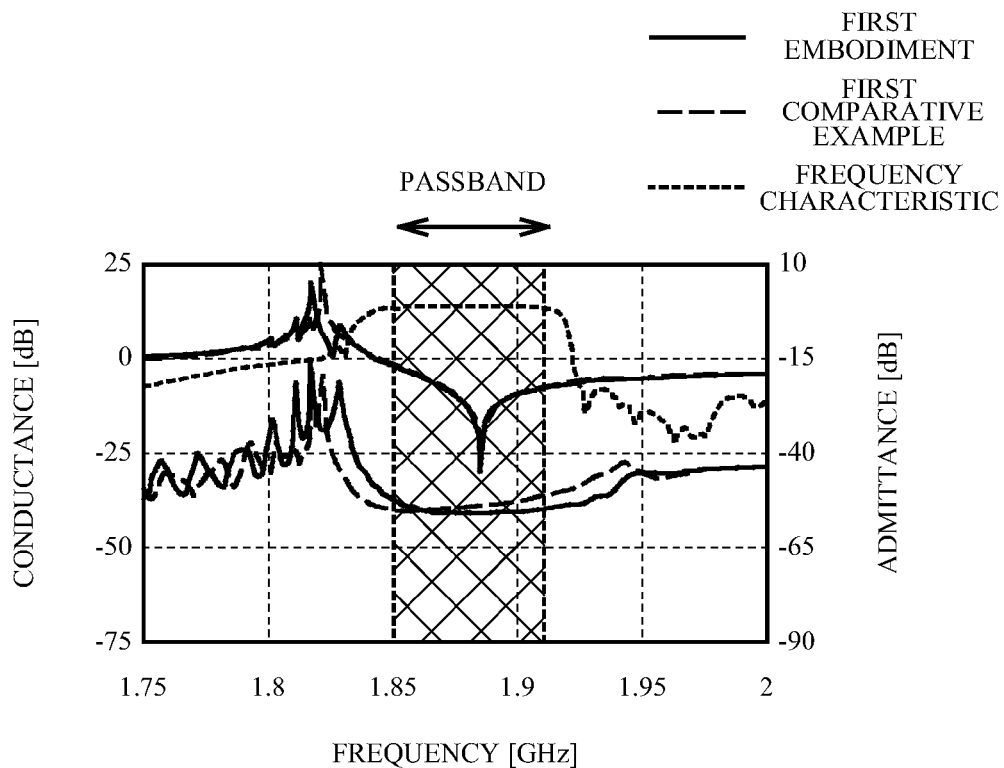
FIG. 10A and FIG. 10B are graphs illustrating calculation results of the conductance and admittance of the parallel resonator.
Figure 10B:
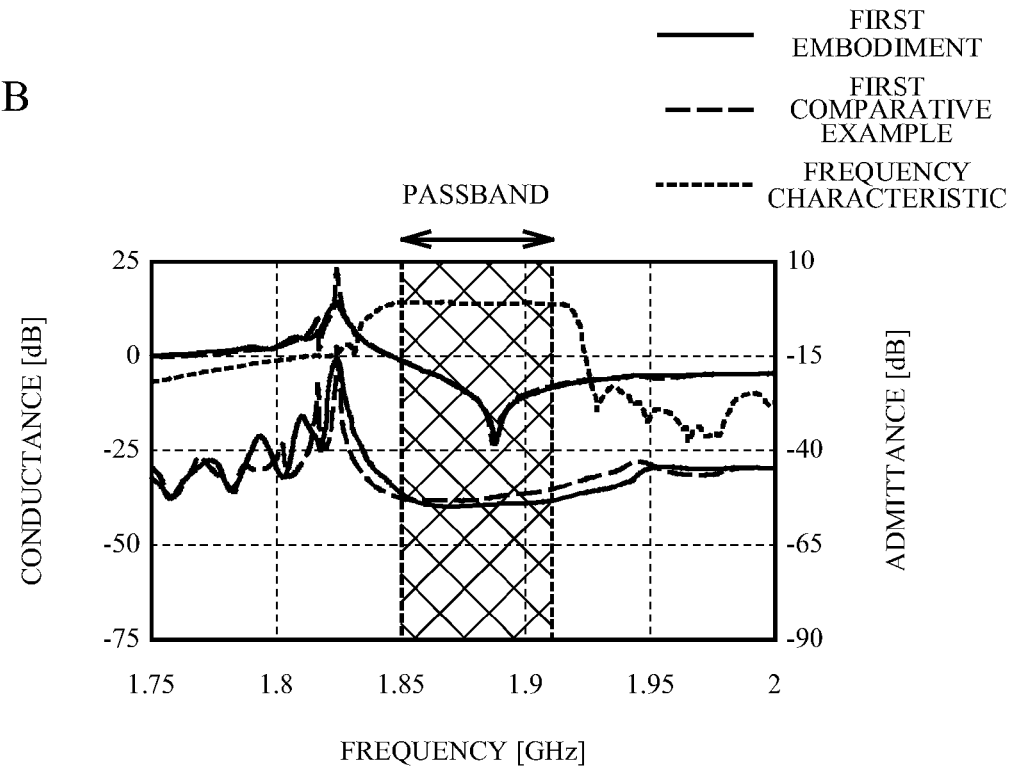

FIG. 9A is a graph illustrating calculation results of the conductance and admittance of the parallel resonator P1, FIG. 9B is a graph illustrating calculation results of the conductance and admittance of the parallel resonator P2, FIG. 10A is a graph illustrating calculation results of the conductance and admittance of the parallel resonator P3, and FIG. 10B is a graph illustrating calculation results of the conductance and admittance of the parallel resonator P4. In the drawings, the dashed line represents calculation results in the first comparative example, and the solid line represents calculation results in the first embodiment. The dotted line represents the frequency characteristic of the ladder-type filter 100.

As illustrated in FIG. 9A through FIG. 10B, the first embodiment can reduce the conductance in the passband compared to the first comparative example. The conductance is greatly reduced especially at a higher frequency side. As illustrated in FIG. 10A and FIG. 10B, the conductance of the first embodiment is slightly greater than that of the first comparative example near the lower end of the passband. As described later, increase in the insertion loss due to the slight increase in the conductance hardly occurs.

Figure 11A:
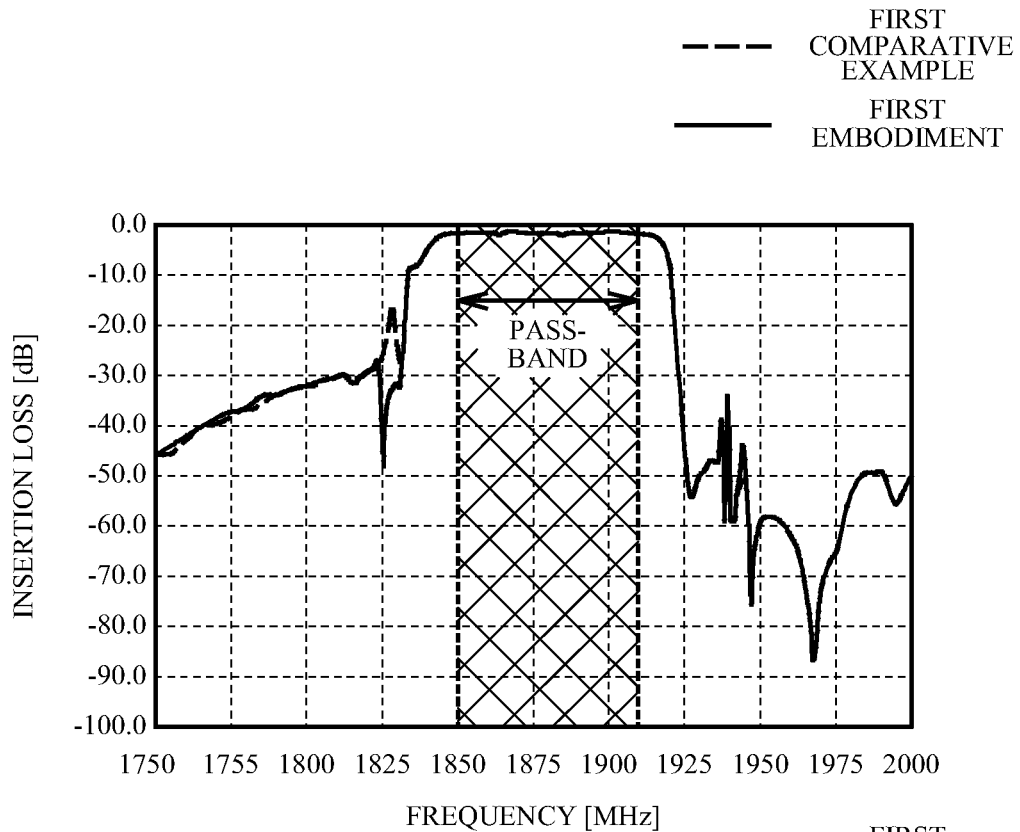
FIG. 11A is a graph illustrating calculation results of the frequency characteristic of the ladder-type filter.
Figure 11B:
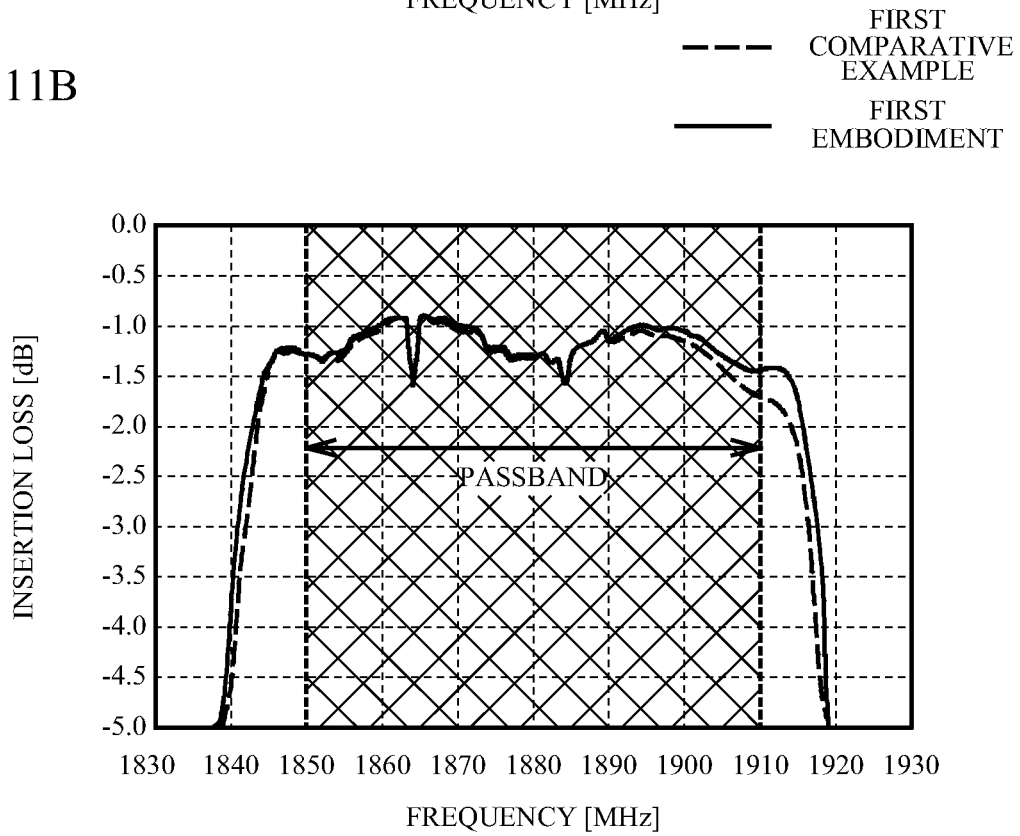
FIG. 11B is an enlarged view around the passband.

FIG. 11A is a graph illustrating calculation results of the frequency characteristic of the ladder-type filter 100. FIG. 11B is an enlarged view around the passband. The horizontal axis represents frequency, and the vertical axis represents insertion loss. The dashed line represents calculation results in the first comparative example, and the solid line represents calculation result in the first embodiment. As illustrated in FIG. 11A and FIG. 11B, the insertion loss in the first embodiment is reduced. The insertion loss is reduced by approximately 0.3 dB especially near the upper end of the passband. In addition, the first embodiment also highly maintains the degree of suppression outside the passband, and exhibits the degree of suppression higher than that of the first comparative example at frequencies lower than the passband. As described above, both the low-loss and the high suppression can be achieved.

When the number of pairs of the IDTs 12 is infinite, SH (Shear horizontal) bulk waves cancel out each other in the stopband, and the radiation of the SH bulk wave is suppressed. However, when the number of pairs is finite, the SH bulk wave is not canceled out at the end portion of the IDT 12 and radiated. The radiation causes loss. The first embodiment can change the phase of the reflection wave by the reflector 14 by configuring Δλ to be less than 0 or G to be less than 0. Therefore, the SH bulk wave can be canceled out between the IDT 12 and the reflector 14, and thus the radiation can be suppressed. This enables to reduce the loss due to the radiation. The number of stages of the ladder-type filter 100 can be changed. In addition, when multiple parallel resonators are provided, it is sufficient that Δλ is configured to be less than 0 or/and G is configured to be less than 0 in at least one of the parallel resonators.

A description will be given of a case where the width of the electrode finger is changed. FIG. 12A through FIG. 12D are diagrams illustrating the IDT 12 and the reflector 14 in which the widths of the electrode fingers 13a and 15a are changed. In each case, the distance D1 is constant, and G is $-0.075\lambda_{IDT}$. Only the outline of the IDT 12 and the reflector 14 is illustrated for ease of understanding.

Figure 12A:
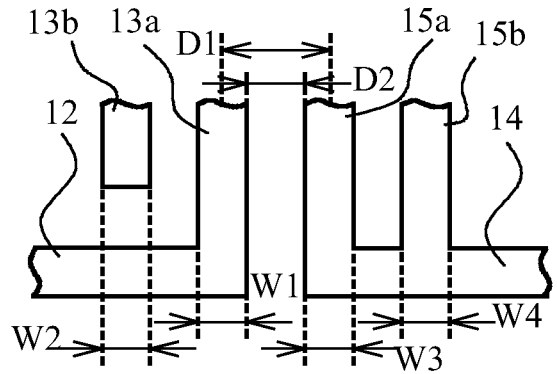
FIG. 12A through FIG. 12D are diagrams illustrating an IDT and a reflector of which the width of the electrode finger is changed.

In the case of FIG. 12A, a width W1 of the electrode finger 13a is equal to a width W2 of an electrode finger 13b of the IDT 12 other than the electrode finger 13a. A width W3 of the electrode finger 15a is equal to a width W4 of an electrode finger 15b of the reflector 14 other than the electrode finger 15a. The duty ratio of each electrode finger is 53% for example. As the distance D1 decreases, the distance D2 between the edge portion of the electrode finger 13a and the edge portion of the electrode finger 15a also decreases. This makes the production of the IDT 12 and the reflectors 14 difficult. The IDT 12 and the reflectors 14 are formed by photolithographic technique. When the distance D2 is small, lithographic exposure becomes difficult, and a metal layer may remain between the IDT 12 and the reflectors 14.

Figure 12B:
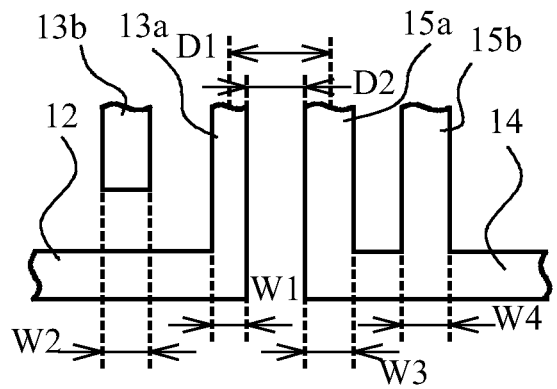

In the case of FIG. 12B, the width W1 of the electrode finger 13a is less than the width W2 of the electrode finger 13b. As described above, when the electrode finger 13a is made to be narrower than the electrode finger 13b, the distance D2 does not need to be made to be small even when the distance D1 is made to be small. Therefore, the IDT 12 and the reflectors 14 can be formed. For example, the duty ratio of the electrode finger 13a is reduced by 6% to be 47%. This makes the width W1 small.

Figure 12C:
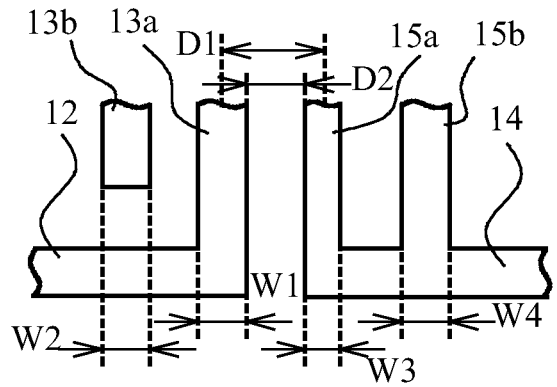
Figure 12D:
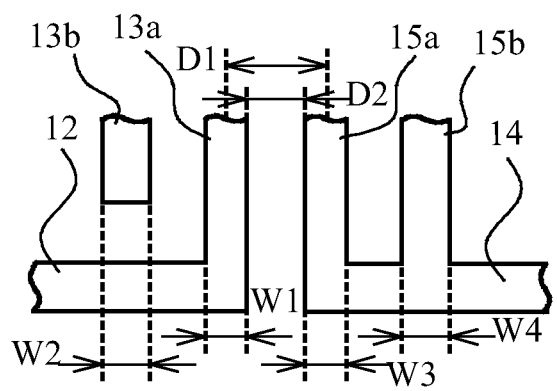

As illustrated in FIG. 12C, the width W3 of the electrode finger 15a may be made to be smaller than the width W4 of the electrode finger 15b. In this case, the duty ratio of the electrode finger 15a is 47% for example. As illustrated in FIG. 12D, it is possible that the electrode finger 13a is made to be narrower than the electrode finger 13b and the electrode finger 15a is made to be narrower than the electrode finger 15b. For example, the duty ratios of the electrode fingers 13a and 15a are reduced by 3% to be 50%. Only the right side of the IDT 12 is illustrated, but the left side of the IDT 12 has the same configuration.

Figure 13A:
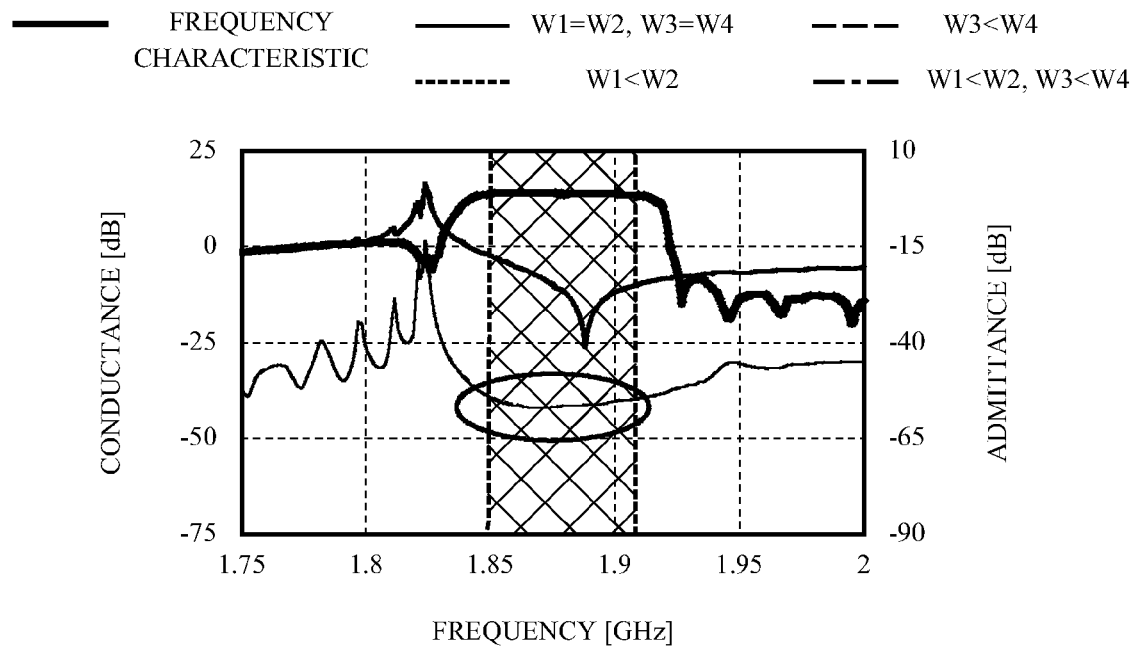
FIG. 13A is a graph illustrating calculation results of conductance and admittance.
Figure 13B:
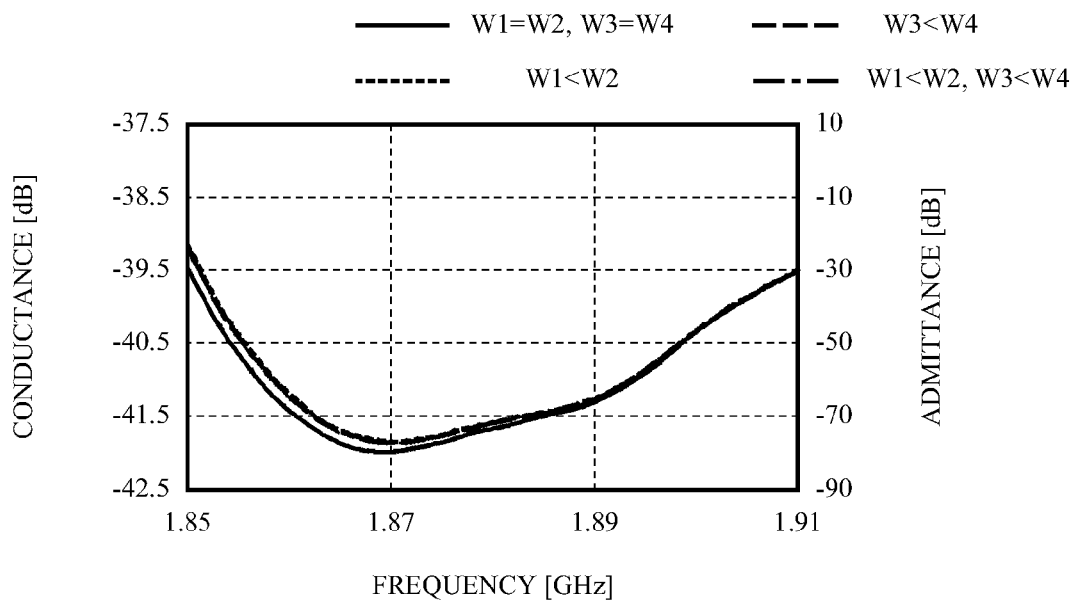
FIG. 13B is an enlarged view around the passband.

FIG. 13A is a graph illustrating calculation results of conductance and admittance. FIG. 13B is an enlarged view around the passband, and illustrates the region surrounded by an ellipse in FIG. 13A. The solid line represents a frequency characteristic. The thin solid line represents calculation results in a case of W1=W2 and W3=W4 (FIG. 12A), the dotted line represents calculation results in a case of W1<W2 (FIG. 12B), the dashed line represents calculation results in a case of W3<W4 (FIG. 12C), and the chain line represents calculation results in a case of W1<W2 and W3<W4 (FIG. 12D).

As illustrated in FIG. 13A and FIG. 13B, the case of W1=W2 and W3=W4 reduces the conductance most. The case of W1<W2 and W3<W4, the case of W3<W4, and the case of W1<W2 reduce the conductance in this order. The difference among the conductance of the four cases is little, and thus the insertion loss does not greatly differ from each other. In the first embodiment, the widths of the electrode fingers 13a and 15a may be changed. A description will next be given of a second embodiment.

Second Embodiment

Figure 14A:
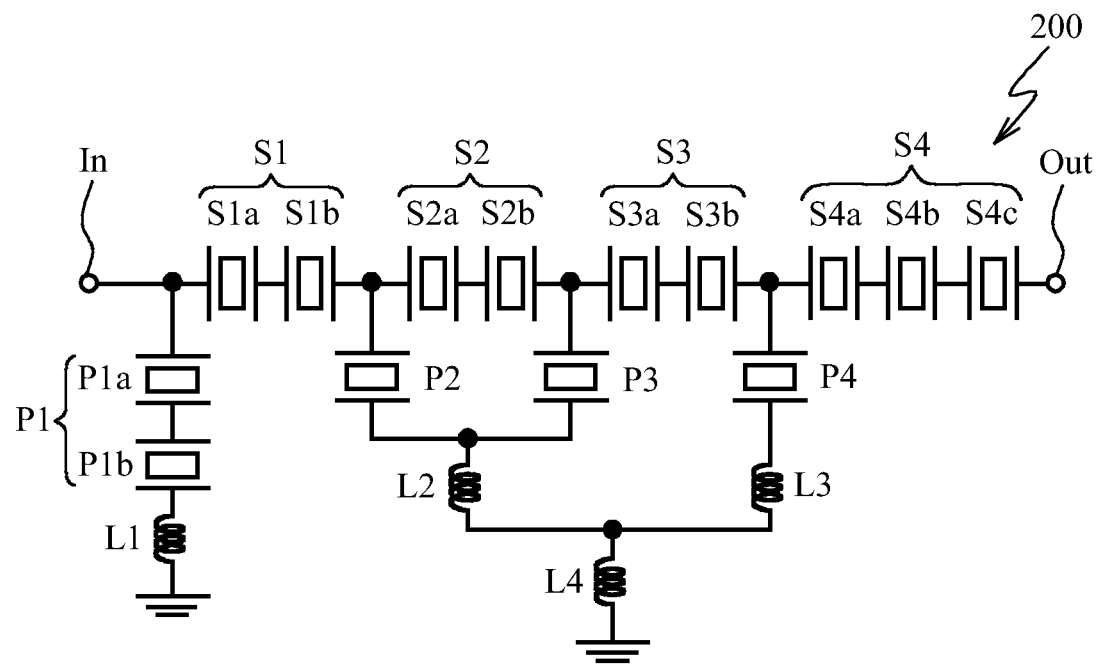
FIG. 14A is a circuit diagram illustrating a ladder-type filter in accordance with a second embodiment.
Figure 14B:
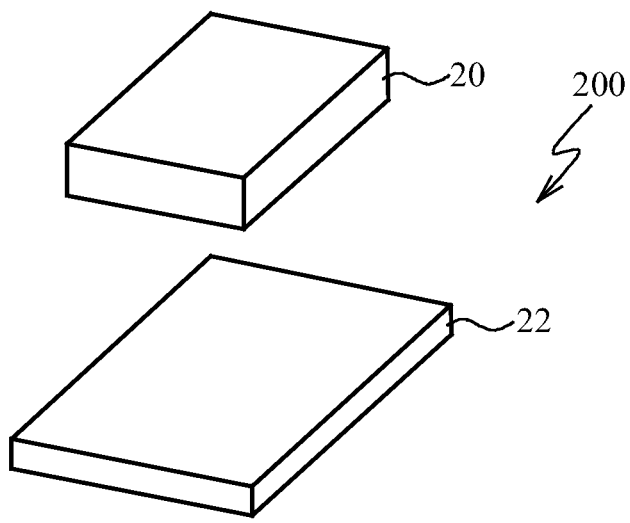
FIG. 14B is a perspective view illustrating an installation example of a filter chip.

The second embodiment is an exemplary filter chip. FIG. 14A is a circuit diagram illustrating a ladder-type filter 200 in accordance with the second embodiment. FIG. 14B is a perspective view illustrating an installation example of a filter chip 20.

As illustrated in FIG. 14A, the series resonator S1 includes resonators S1a and S1b. The series resonator S2 includes resonators S2a and S2b. The series resonator S3 includes resonators S3a and S3b. The series resonator S4 includes resonators S4a, S4b, and S4c. The parallel resonator P1 includes resonators P1a and P1b, and connected to a ground through the inductor L1. First ends of the parallel resonators P2 and P3 are commonly connected to a first end of the inductor L2. A first end of the parallel resonator P4 is connected to a first end of the inductor L3. The inductors L2 and L3 are commonly connected to the inductor L4, and then connected to a ground through the inductor L4.

The filter chip 20 illustrated in FIG. 14B includes the ladder-type filter 200. The filter chip 20 is flip-chip bonded on a package 22 by bumps (not illustrated) formed of a metal such as gold (Au) for example. The package 22 is a multilayered substrate formed by stacking insulating materials such as a ceramic. The filter chip 20 may be sealed with a resin or a metal for example.

Figure 15:
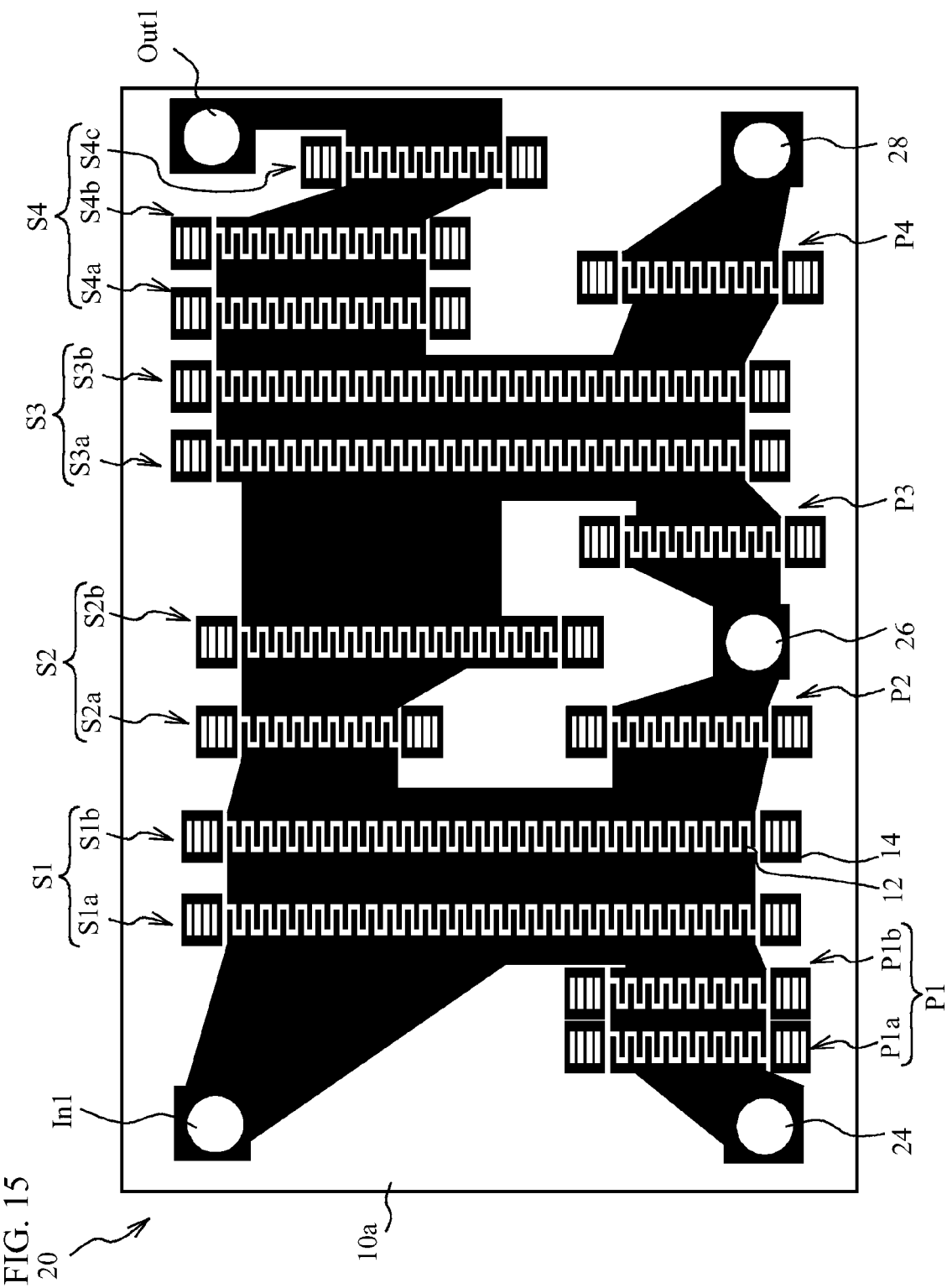
FIG. 15 is a plan view illustrating the filter chip.

FIG. 15 is a plan view illustrating the filter chip 20, and illustrates the bottom surface that faces the package 22. The white circles in the drawing indicate the locations to which the bumps for flip-chip bonding are connected. As illustrated in FIG. 15, the series resonators S1 through S4 and the parallel resonators P1 through P4 are located on a piezoelectric substrate 10a. The piezoelectric substrate 10a is a piezoelectric single crystal substrate for example. Each resonator is a SAW resonator. The resonator S1a is connected to an input terminal In1, and the resonator S4c is connected to an output terminal Out1. The resonator P1a of the parallel resonator P1 is connected to a terminal 24. The parallel resonators P2 and P3 are connected to a terminal 26. The parallel resonator P4 is connected to a terminal 28.

The package 22 includes a first layer 22a that is a die attach layer, a second layer 22b that is an interlayer, and a third layer 22c that is a foot pad layer. The layers are interconnected by via wirings. The wiring and the via wiring located in each layer are formed of a metal such as copper (Cu) for example.

FIG. 16A is a plan view illustrating the first layer 22a of the package 22. The dashed line indicates a position on which the filter chip 20 is mounted. The input terminal In2 of the first layer 22a is coupled to the input terminal In1 of the filter chip 20, and then coupled to a via wiring 32a through a wiring 30a. The output terminal Out2 is coupled to the output terminal Out1, and then coupled to a via wiring 32b through a wiring 30b. A ground terminal GND1 is coupled to the terminal 24, and then coupled to a via wiring 32c through a wiring 30c. A ground terminal GND2 is coupled to the terminal 26, and a ground terminal GND3 is coupled to the terminal 28. The ground terminals GND2 and GND3 are coupled to a via wiring 32d through a wiring 30d. The via wirings 32a through 32d pierce the first layer 22a in the thickness direction.

FIG. 16B is a plan view illustrating the second layer 22b of the package 22. The via wiring 32a of the first layer 22a is coupled to a via wiring 32e through a wiring 30e of the second layer 22b. The via wiring 32b is coupled to a via wiring 32f through a wiring 30f. The via wiring 32c is coupled to a via wiring 32g through a wiring 30g. The via wiring 32d is coupled to a via wiring 32h through a wiring 30h.

FIG. 16C is a plan view illustrating the third layer 22c of the package 22 transparently. The via wiring 32e of the second layer 22b is coupled to an input terminal In3. The via wiring 32f is coupled to an output terminal Out3. The via wiring 32g is coupled to a ground terminal GND4. The via wiring 32h is coupled to a ground terminal GND5. The wirings 30c and 30g and the via wirings 32c and 32g contribute to generation of the inductor L1. The wirings 30d and 30h and the via wirings 32d and 32h contribute to generation of the inductors L2 through L4.

Calculated are parameters ($\Delta\lambda$ and G) with which the conductance of the parallel resonators P1 through P4 becomes minimum. A second comparative example is an example before optimization. Table 2 is a table listing parameters of the parallel resonators P1 through P4 in the second comparative example and the second embodiment. A duty ratio 1 is the duty ratio of the electrode finger 13a, and a duty ratio 2 is the duty ratio of the electrode finger 15a.

TABLE 2

| | RESONATOR P1 | | | |
|---|---|---|---|---|
| PARAMETER | $\Delta\lambda$ (%) | G | DUTY RATIO 1 (%) | DUTY RATIO 2 (%) |
| SECOND COMPARATIVE EXAMPLE | −0.64 | 0 | 50.8 | 50.8 |
| SECOND EMBODIMENT | −0.64 | $-0.075\lambda_{IDT}$ | 47.8 | 47.8 |

| | RESONATOR P2 | | | |
|---|---|---|---|---|
| PARAMETER | $\Delta\lambda$ (%) | G | DUTY RATIO 1 (%) | DUTY RATIO 2 (%) |
| SECOND COMPARATIVE EXAMPLE | 0.40 | 0 | 50.8 | 50.8 |
| SECOND EMBODIMENT | 0.40 | $-0.075\lambda_{IDT}$ | 47.8 | 47.8 |

| | RESONATOR P3 | | | |
|---|---|---|---|---|
| PARAMETER | $\Delta\lambda$ (%) | G | DUTY RATIO 1 (%) | DUTY RATIO 2 (%) |
| SECOND COMPARATIVE EXAMPLE | −0.69 | 0 | 50.8 | 50.8 |
| SECOND EMBODIMENT | −0.69 | $-0.1\lambda_{IDT}$ | 47.8 | 47.8 |

| | RESONATOR P4 | | | |
|---|---|---|---|---|
| PARAMETER | $\Delta\lambda$ (%) | G | DUTY RATIO 1 (%) | DUTY RATIO 2 (%) |
| SECOND COMPARATIVE EXAMPLE | −0.46 | 0 | 50.8 | 50.8 |
| SECOND EMBODIMENT | −0.46 | $-0.075\lambda_{IDT}$ | 47.8 | 47.8 |

The ladder-type filter 200 is designed using the parameters listed in Table 2, and then frequency characteristics are compared between the second comparative example and the second embodiment. The parameters other than those listed in Table 2 are the same as the parameters described for the simulation of FIG. 6A.

Figure 17A:
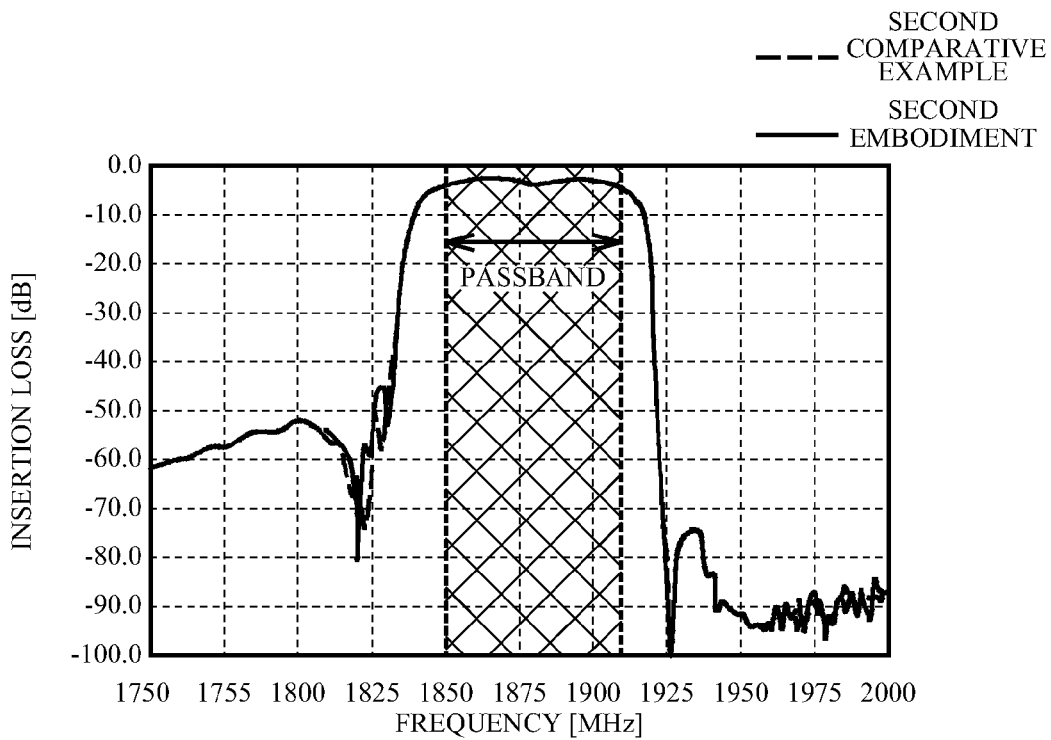
FIG. 17A is a graph illustrating calculation results of the frequency characteristic of a ladder-type filter.
Figure 17B:
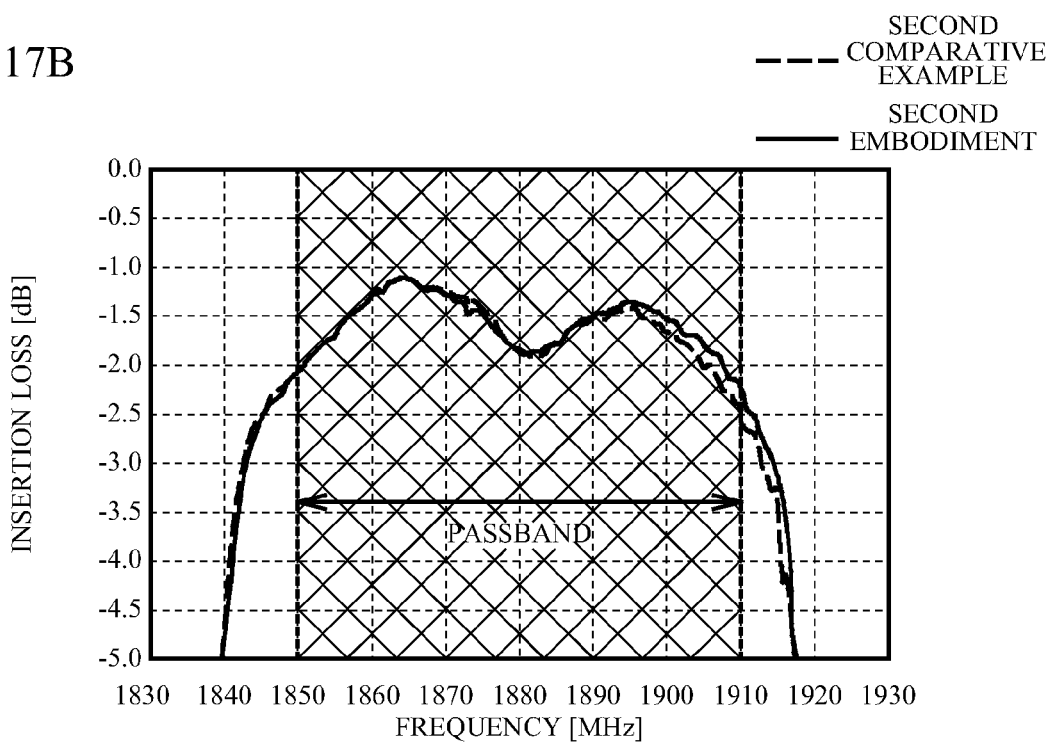
FIG. 17B is an enlarged view around the passband.

FIG. 17A is a graph illustrating calculation results of the frequency characteristic of the ladder-type filter 200. FIG. 17B is an enlarged view around the passband. As illustrated in FIG. 17A and FIG. 17B, the insertion loss in the second embodiment is reduced compared to that in the second comparative example. The insertion loss is reduced by approximately 0.3 dB especially near the upper end of the passband. In addition, the second embodiment exhibits the similar degree of suppression to the second comparative example outside the passband.

Figure 18:
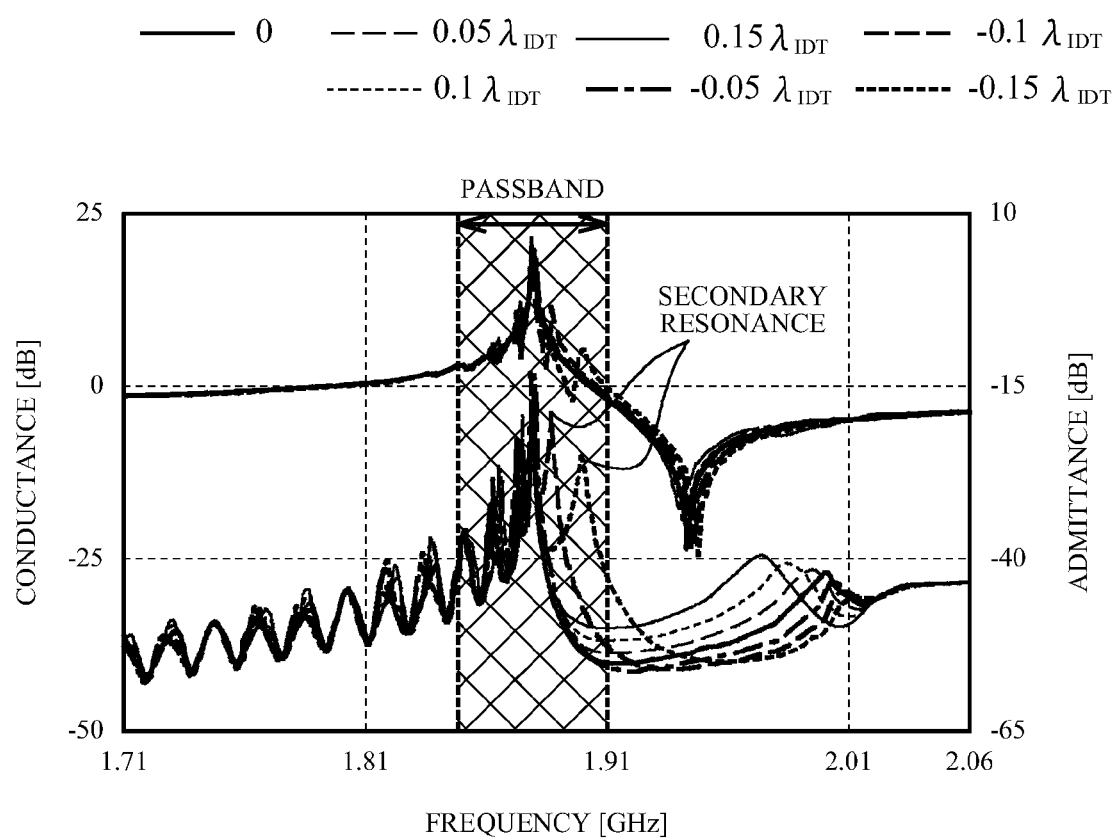
FIG. 18 is a graph illustrating calculation results of the conductance and admittance of a series resonator.

As described above, configuring $\Delta\lambda$ to be less than 0 or/and G to be less than 0 enables to cancel out the SH bulk wave between the IDT 12 and the reflectors 14, and suppress the radiation of the SH bulk wave. Therefore, the above described configuration is applicable to resonators including an IDT. For example, G can be configured to be less than 0 in a series resonator. FIG. 18 is a graph illustrating calculation result of the conductance and admittance of the series resonator.

As illustrated in FIG. 18, the secondary resonance is located in the passband, and thus a spurious response due to the secondary resonance occurs in the passband. This interferes with the acquisition of flat frequency characteristics in the passband. In addition, although the calculation result is not illustrated, the secondary resonance is also located in the passband in a case of $\Delta\lambda<0$. Therefore, it is not preferable to configure $\Delta\lambda$ to be less than 0 or/and G to be less than 0 in the series resonator.

Figure 19A:
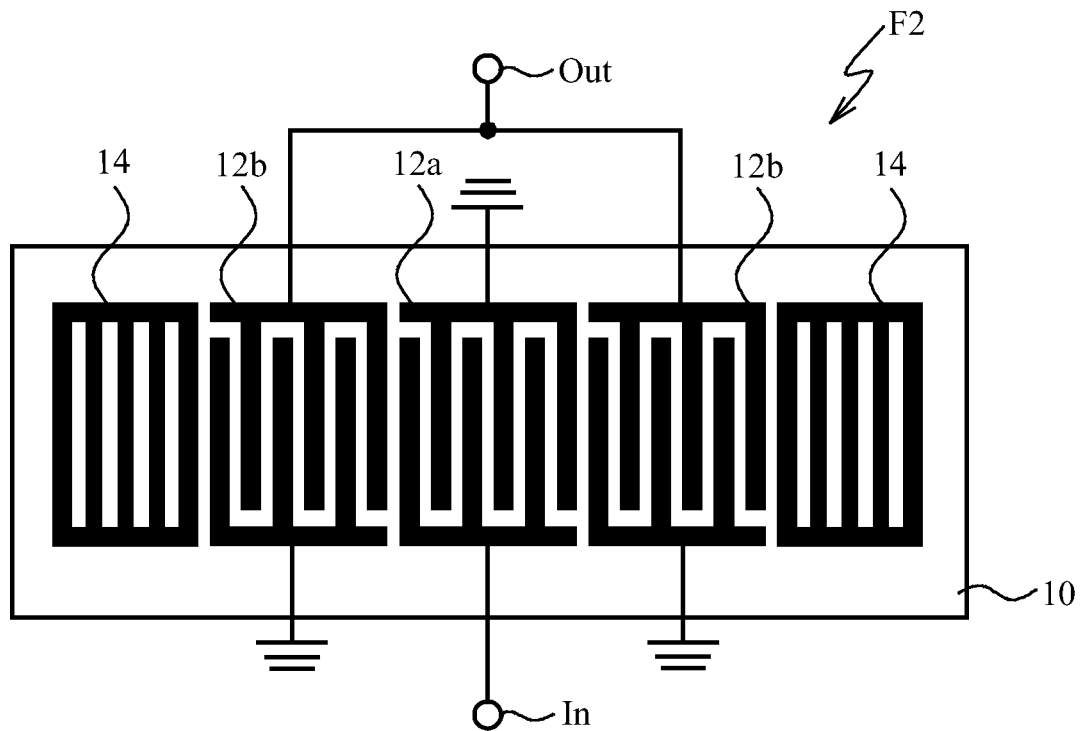
FIG. 19A is a plan view illustrating a DMS filter.

In addition, it is not preferable to configure $\Delta\lambda$ to be less than 0 or/and G to be less than 0 in a double mode SAW (DMS) filter. FIG. 19A is a plan view illustrating a DMS filter F2.

As illustrated in FIG. 19A, IDTs 12*b* for output are located at both sides of an IDT 12*a* for input. The IDT 12*a* is coupled to the input terminal In, and the IDTs 12*b* are coupled to the output terminal Out. Generally, $\Delta\lambda$ is greater than 0 ($\lambda_{IDT}<\lambda_{ref}$) and G is equal to 0 (D1=0.25($\lambda_{IDT}+\lambda_{ref}$)) in the DMS. When $\Delta\lambda$ is configured to be less than 0 in the DMS filter F2, the stopband of the reflector 14 becomes higher than the passband. Therefore, the insertion loss greatly increases at the lower end side of the passband. In addition, when G is less than 0, the continuity of grating periods between the IDT 12*b* at the left side and the reflector 14 and between the IDT 12*b* at the right side and the reflector 14 is deteriorated. The discontinuity of the grating period causes increase in the insertion loss. Therefore, it is preferable not to configure $\Delta\lambda$ to be less than 0 or/and G to be less than 0 in the DMS filter F2.

Figure 19B:
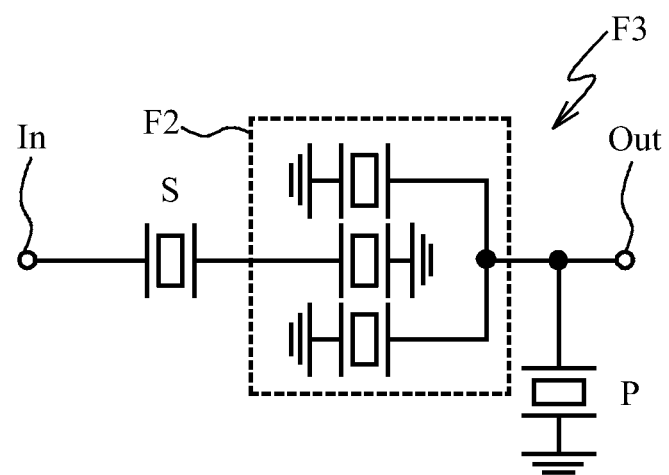
FIG. 19B is a circuit diagram illustrating an acoustic wave filter.

However, it is effective to configure $\Delta\lambda$ to be less than 0 or/and G to be less than 0 in an acoustic wave filter formed by combining the DMS filter F2 and the parallel resonator P. FIG. 19B is a circuit diagram illustrating an acoustic wave filter F3.

As illustrated in FIG. 19B, the series resonator S and the DMS filter F2 are connected in series between the In and the Out. The parallel resonator P is connected to a node between the DMS filter F2 and the output terminal Out. In the parallel resonator P, the insertion loss of the acoustic wave filter F3 can be reduced by configuring $\Delta\lambda$ to be less than 0 or/and G to be less than 0. A multimode filter other than the DMS filter F2 may be used. The series resonator S may be omitted. In addition, the above described structure can be applied to an acoustic wave filter in which the DMS filter F2 is connected in series to a ladder-type filter. As described above, it is sufficient if $\Delta\lambda$ is configured to be less than 0 or/and G is configured to be less than 0 in an acoustic wave filter including at least the parallel resonator P.

Figure 20A:
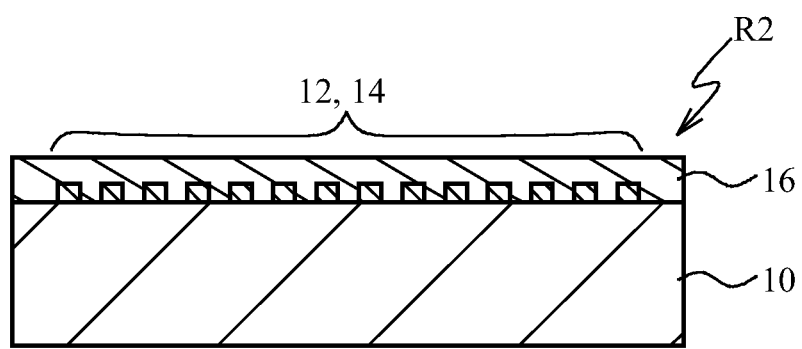
FIG. 20A is a cross-sectional view illustrating a Love wave resonator.
Figure 20B:
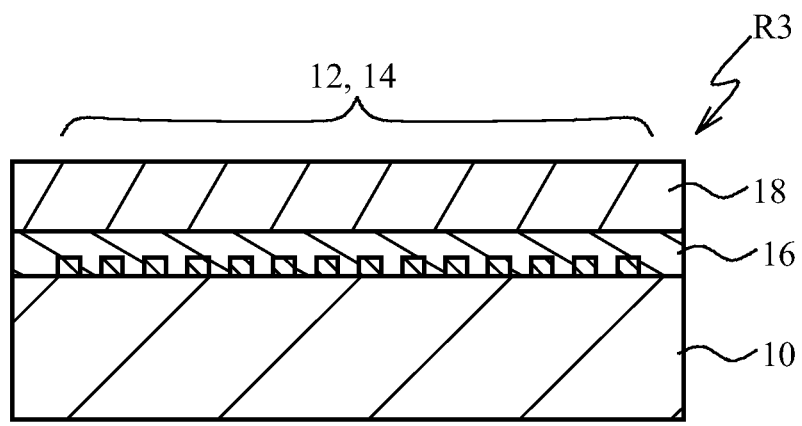
FIG. 20B is a cross-sectional view illustrating a boundary acoustic wave resonator.

A description will be given of an application example to a resonator other than the SAW resonator. FIG. 20A is a cross-sectional view illustrating a Love wave resonator R2. FIG. 20B is cross-sectional view illustrating a boundary acoustic wave resonator R3. A description for a structure same as the already-described structure is omitted.

As illustrated in FIG. 20A, a dielectric layer 16 is located on the piezoelectric substance 10 so as to cover the IDT 12 and the reflectors 14. The dielectric layer 16 is formed of silicon oxide ($SiO_2$) for example. As illustrated in FIG. 20B, a dielectric layer 18 is located on the dielectric layer 16. The dielectric layer 18 is formed of aluminum oxide ($Al_2O_3$). The acoustic velocity in the dielectric layer 16 is slower than the acoustic velocity in the dielectric layer 18. Therefore, the acoustic wave is confined in the dielectric layer 16. For example, the use of the resonators R2 and R3 as parallel resonators enables to configure $\Delta\lambda$ to be less than 0 or/and G to be less than 0.

Third Embodiment

Figure 21:
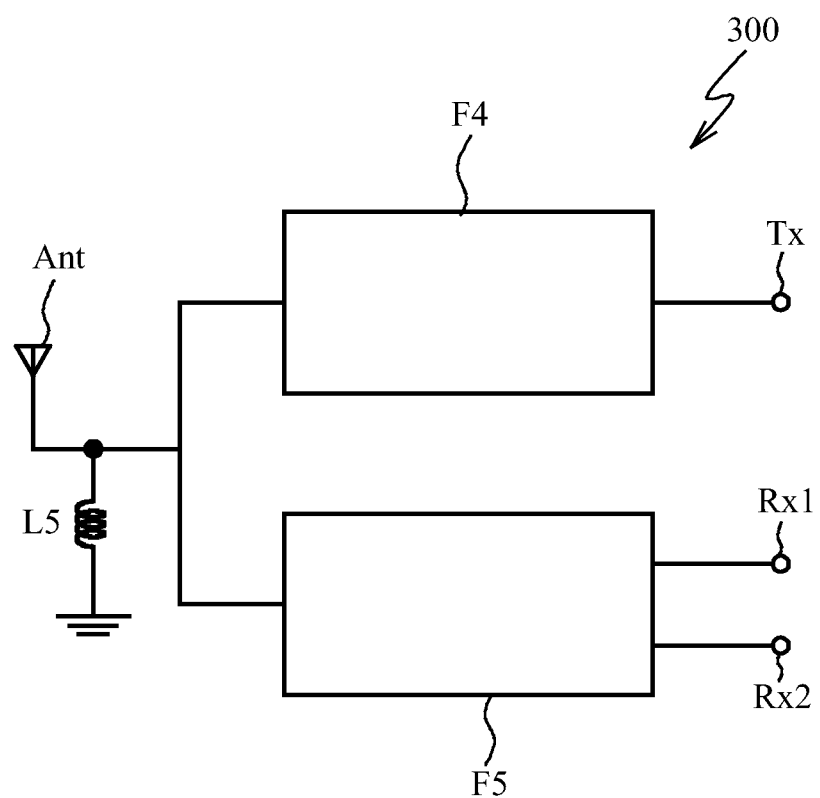
FIG. 21 is a block diagram illustrating a duplexer in accordance with a third embodiment.

A third embodiment is an exemplary duplexer. FIG. 21 is a block diagram illustrating a duplexer 300 in accordance with the third embodiment.

As illustrated in FIG. 21, the duplexer 300 includes a transmission filter F4 and a reception filter F5. The transmission filter F4 is coupled to a transmission terminal Tx. The reception filter F5 is coupled to reception terminals Rx1 and Rx2. The reception terminals Rx1 and Rx2 are balanced terminals. The transmission filter F4 and the reception filter F5 are commonly coupled to an antenna Ant. A first end of the inductor L5 is coupled to the antenna Ant, and a second end thereof is grounded.

At least one of the transmission filter F4 and the reception filter F5 includes a ladder-type filter. The ladder-type filter has an optimized structure described in the first and second embodiments, or is configured so that at least $\Delta\lambda$ is less than 0 or G is less than 0. This enables to reduce the insertion loss of the duplexer 300. In addition, the high degree of suppression can be obtained outside the passband.

Fourth Embodiment

Figure 22:
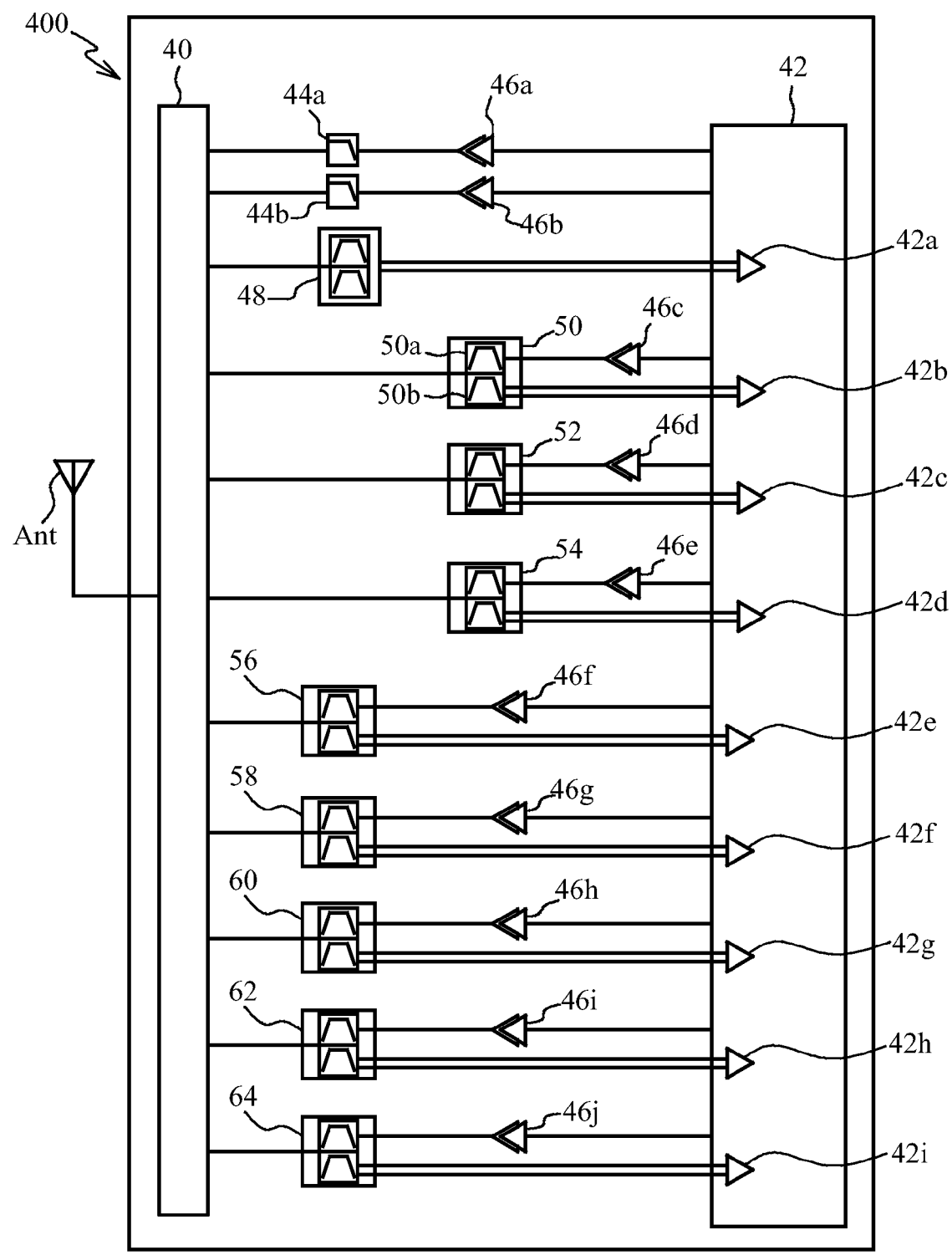
FIG. 22 is a block diagram illustrating a module in accordance with a fourth embodiment.

A fourth embodiment is an exemplary module. FIG. 22 is a block diagram illustrating a module 400 in accordance with the fourth embodiment.

As illustrated in FIG. 22, the module 400 includes the antenna Ant, a switch 40, an IC (Integrated Circuit) 42, low-pass filters (LPF) 44*a* and 44*b*, power amplifiers (PA) 46*a* through 46*j*, and duplexers 48, 50, 52, 54, 56, 58, 60, 62, and 64.

The IC 42 includes low noise amplifiers (LNA) 42*a* through 42*i*. The IC 42 functions as a direct converter that converts the frequency of a signal. The duplexer 50 includes a transmission filter 50*a* and a reception filter 50*b*. Other duplexers include a transmission filter and a reception filter as with the duplexer 50.

The power amplifier (PA) 46*a* is connected between the IC 42 and the LPF 44*a*. The PA 46*b* is connected between the IC 42 and the LPF 44*b*. The duplexer 48 is coupled to the LNA 42*a*. The transmission filter 50*a* of the duplexer 50 is coupled to the PA 46*c*, and the reception filter 50*b* is coupled to the LNA 42*b*. Other duplexers, PAs, and LNAs are coupled in the same manner. The switch 40 selects and connects one of the LPF 44*a* and 44*b* and the duplexers to the antenna Ant.

At least one of the filters included in the module 400 is a ladder-type filter, and has an optimized structure as described in the first and second embodiments, or is configured so that at least $\Delta\lambda$ is be less than 0 or G is less than 0. This enables to reduce the insertion loss of the module 400. In addition, the high degree of suppression can be obtained outside the passband.

Although the embodiments of the present invention have been described in detail, it is to be understood that the various change, substitutions, and alterations could be made hereto without departing from the spirit and scope of the invention.

What is claimed is:

1. An acoustic wave filter comprising:
at least a parallel resonator, wherein
at least one of the parallel resonator includes a first piezoelectric substance, a first IDT (Interdigital Transducer) located on the first piezoelectric substance, and first reflectors located on the first piezoelectric substance so as to sandwich the IDT, and
G is less than 0 and greater than or equal to $-0.05\lambda_{IDT}$ where $D1=0.25(\lambda_{ref}+\lambda_{IDT})+G$, a distance between a center of a first electrode finger that is an electrode finger closest to the first reflector among electrode fingers of the first IDT and a center of a second electrode finger that is an electrode finger closest to the first IDT among electrode fingers of the first reflector is D1, a period of the electrode fingers of the first IDT is $\lambda_{IDT}$, and a period of the electrode fingers of the first reflector is $\lambda_{ref}$.

2. The acoustic wave filter according to claim 1, further comprising:
a series resonator coupled to the parallel resonator.

3. The acoustic wave filter according to claim 1, wherein $\Delta\lambda$ is less than 0 and equal to or greater than $-1$, where $\Delta\lambda=100(\lambda_{ref}-\lambda_{IDT})/\lambda_{IDT}$.

4. The acoustic wave filter according to claim 1, wherein the first electrode finger is narrower than the electrode finger of the first IDT other than the first electrode finger.

5. The acoustic wave filter according to claim 1, wherein the second electrode finger is narrower than the electrode finger of the first reflector other than the second electrode finger.

6. The acoustic wave filter according to claim 1, wherein the distance between the center of the first electrode finger and the center of the second electrode finger is less than $0.24375(\lambda_{IDT}+\lambda_{ref})$.

7. The acoustic wave filter according to claim 1, further comprising:
a multimode filter coupled to the parallel resonator.

8. A duplexer comprising:
the acoustic wave filter according to claim 1.

9. A module comprising:
the acoustic wave filter according to claim 1.

10. The acoustic wave filter according to claim 2, wherein:
the at least a parallel resonator is connected in parallel between an input terminal and an output terminal;
the series resonator is connected in series between the input terminal and the output terminal;
the series resonator includes a second piezoelectric substance, a second IDT located on the second piezoelectric substance, and second reflectors located on the second piezoelectric substance so as to sandwich the second IDT, and
G2 is greater than or equal to 0, where $D2=0.25(\lambda_{ref2}+\lambda_{IDT2})+G2$ a distance between a center of a third electrode finger that is an electrode finger closest to the second reflector among electrode fingers of the second IDT and a center of a fourth electrode finger that is an electrode finger closest to the second IDT among electrode fingers of the second reflector is D2, a period of the electrode fingers of the second IDT is $\lambda_{IDT2}$ and a period of the electrode fingers of the second reflector is $\lambda_{ref2}$.

11. An acoustic wave filter comprising:
at least a parallel resonator, wherein
at least one of the parallel resonator includes a first piezoelectric substance, a first IDT located on the first piezoelectric substance, and first reflectors located on the first piezoelectric substance so as to sandwich the first IDT, and
$\Delta\lambda$ is less than 0 and greater than $-1$ or equal to $-1$, where $\Delta\lambda=100(\lambda_{ref}-\lambda_{IDT})/\lambda_{IDT}$, a period of electrode fingers of the first IDT is $\lambda_{IDT}$, and a period of electrode fingers of the first reflector is $\lambda_{ref}$.

12. A duplexer comprising:
the acoustic wave filter according to claim 11.

13. A module comprising:
the acoustic wave filter according to claim 11.

14. The acoustic wave filter according to claim 11, further comprising a series resonator is connected in series between an input terminal and an output terminal;
wherein:
the at least a parallel resonator is connected in parallel between the input terminal and the output terminal;
the series resonator includes a second piezoelectric substance, a second IDT located on the second piezoelectric substance, and second reflectors located on the second piezoelectric substance so as to sandwich the second IDT, and
$\Delta\lambda2$ is greater than or equal to 0, where $\Delta\lambda2=100(\lambda_{ref2}-\lambda_{IDT2})/\lambda_{IDT2}$, a period of electrode fingers of the second IDT is $\lambda_{IDT2}$, and a period of electrode fingers of the second reflector is $\lambda_{ref2}$.

* * * * *